(12) United States Patent
Shimizu et al.

(10) Patent No.: US 10,999,551 B2
(45) Date of Patent: May 4, 2021

(54) SOLID-STATE IMAGE CAPTURE DEVICE INCLUDING STACKED PIXEL SUBSTRATE AND CIRCUIT SUBSTRATE AND IMAGE CAPTURE DEVICE

(71) Applicant: PANASONIC INTELLECTUAL PROPERTY MANAGEMENT CO., LTD., Osaka (JP)

(72) Inventors: Yuusuke Shimizu, Kyoto (JP); Kazutoshi Onozawa, Osaka (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 0 days.

(21) Appl. No.: 16/661,854

(22) Filed: Oct. 23, 2019

(65) Prior Publication Data

US 2020/0059620 A1 Feb. 20, 2020

Related U.S. Application Data

(63) Continuation of application No. PCT/JP2018/015409, filed on Apr. 12, 2018.

(30) Foreign Application Priority Data

Apr. 25, 2017 (JP) ............................. JP2017-086176

(51) Int. Cl.
*H04N 5/335* (2011.01)
*H04N 5/369* (2011.01)
(Continued)

(52) U.S. Cl.
CPC ....... *H04N 5/379* (2018.08); *H01L 23/49816* (2013.01); *H01L 25/0657* (2013.01);
(Continued)

(58) Field of Classification Search
CPC ................ H04N 5/379; H04N 5/37455; H01L 23/49816; H01L 25/0657; H01L 27/14609; H01L 27/14634; H01L 27/14636
(Continued)

(56) References Cited

U.S. PATENT DOCUMENTS 6,172,351 B1 1/2001 Kimura
2013/0320197 A1* 12/2013 Asayama ............... H04N 5/379
250/208.1
(Continued)

FOREIGN PATENT DOCUMENTS

JP H11-074494 A 3/1999
JP 2015-126043 A 7/2015
(Continued)

OTHER PUBLICATIONS

International Search Report and Written Opinion dated Jun. 26, 2018 in International Patent Application No. PCT/JP2018/015409; with partial English translation.

*Primary Examiner* — Usman A Khan
(74) *Attorney, Agent, or Firm* — McDermott Will & Emery LLP

(57) ABSTRACT

A solid-state image capture device includes a first semiconductor substrate and a second semiconductor substrate. The first semiconductor substrate includes a first connection and a pixel array in which a plurality of pixels are arranged in a matrix. The second semiconductor substrate includes a second connection and a pad area including a plurality of pad electrodes for electrical connection with external equipment. The second semiconductor substrate controls the pixel array. The first and second semiconductor substrates are stacked and joined together, with the first and second connections electrically connected to each other. The first and second
(Continued)

semiconductor substrates are substantially equal in size, and the pad electrodes are included in only the second semiconductor substrate.

19 Claims, 24 Drawing Sheets

(51) Int. Cl.
  *H01L 23/498* (2006.01)
  *H01L 25/065* (2006.01)
  *H01L 27/146* (2006.01)
  *H04N 5/3745* (2011.01)

(52) U.S. Cl.
  CPC .. *H01L 27/14609* (2013.01); *H01L 27/14634* (2013.01); *H01L 27/14636* (2013.01); *H04N 5/37455* (2013.01)

(58) Field of Classification Search
  USPC .......................................................... 348/294
  See application file for complete search history.

(56) References Cited

U.S. PATENT DOCUMENTS

| | | | |
|---|---|---|---|
| 2014/0008745 A1* | 1/2014 | Maruyama | H01L 27/14634 257/431 |
| 2015/0163403 A1* | 6/2015 | Wakabayashi | H04N 5/3698 348/308 |
| 2015/0189214 A1* | 7/2015 | Kurose | H01L 25/18 250/208.1 |
| 2015/0296164 A1* | 10/2015 | Hirai | H04N 5/3765 348/308 |
| 2018/0152657 A1 | 5/2018 | Miyazawa | |

FOREIGN PATENT DOCUMENTS

| | | |
|---|---|---|
| WO | 2014/007004 A1 | 1/2014 |
| WO | 2016/185901 A1 | 11/2016 |

* cited by examiner

SOLID-STATE IMAGE CAPTURE DEVICE INCLUDING STACKED PIXEL SUBSTRATE AND CIRCUIT SUBSTRATE AND IMAGE CAPTURE DEVICE

CROSS REFERENCE TO RELATED APPLICATIONS

This application is a U.S. continuation application of PCT International Patent Application Number PCT/JP2018/015409 filed on Apr. 12, 2018, claiming the benefit of priority of Japanese Patent Application Number 2017-086176 filed on Apr. 25, 2017, the entire contents of which are hereby incorporated by reference.

BACKGROUND

1. Technical Field

The present disclosure relates to a solid-state image capture device and an image capture device.

2. Description of the Related Art

A solid-state imaging device according to a conventional technique disclosed in WO 2014/007004 (PTL 1) will be described hereinafter with reference to FIG. 26. Referring to FIG. 26, solid-state imaging device 1010A has a so-called stacked structure that includes first chip 1020 and second chip 1030 as semiconductor substrates, with first chip 1020 stacked on the upper side and second chip 1030 stacked on the lower side.

First chip 1020 includes pixel array 1021 consisting of a plurality of pixels 1040, and pad areas 1221 and 1222 and via areas 1231 and 1232 that are provided in the periphery. Second chip 1030 includes signal processor 1031, memory 1032, data processor 1033, and controller 1034.

Each pixel 1040 arranged in pixel array 1021 outputs an analog signal to a signal line.

Signal processor 1031 converts analog signals that are output to the signal lines to digital signals (AD conversion) and transfers data on the digital signals to memory 1032 at a first speed higher than the frame rate.

Memory 1032 stores data generated by signal processor 1031.

Data processor 1033 reads out pixel data from memory 1032 at a second speed lower than the first speed.

Controller 1034 performs, for example, control of data stored in memory 1032.

The above-described conventional technique, however, has a problem in that as the chip size decreases, the proportion of pad areas 1221 and 1222 to first chip 1020 increases and the area ratio of the imaging area, i.e., pixel array 1021, decreases. In other words, it is difficult to achieve both an increase in the area ratio of imaging area and a downsizing of the chip. The increase in the area ratio of imaging area as used herein refers to increasing the proportion of the imaging area to the chip area.

In the fields of endoscope cameras, ultra-small surveillance cameras, vehicle-mounted cameras, and mobile products, if pad areas 1221 and 1222 are placed in first chip 1020 as in the configuration of PTL 1, the proportion of pad areas 1221 and 1222 to the chip size will increase.

For example, in the cases where the chip sizes are approximately 3-mm square, approximately 2-mm square, and approximately 1-mm square and if the pad size is 0.15-mm square, the proportions of the pad areas to the chip size are approximately 10%, approximately 15%, approximately 30%, respectively, at a minimum. As a result, the proportion of the imaging area to the chip size decreases more and more as the chip size decreases. That is, it is difficult to increase the number of pixels.

In recent years, there is increasing demand to reduce the chip size including packaging, and there is, for example, packaging technology called chip size packaging (CSP) using through-silicon vias (TSVs). However, when the configuration of the solid-state imaging device disclosed in PTL 1 is used, it is difficult to ensure a region for TSVs because circuitry (second chip) is disposed under the pads (first chip) in a stacked sensor in which first chip 1020 and second chip 1030 are stacked.

That is, the pads on the first chip cannot be connected to solder balls provided on the rear face of a mount board on which a stacked body of the first chip and the second chip is mounted. Thus, the above-described configuration cannot use CSP technology. In order to achieve the aforementioned connection, it is necessary to ensure a region for TSVs, and this inevitably increases the chip size.

SUMMARY

In view of the above-described problem, it is an object of the present disclosure to provide a solid-state image capture device and an image capture device that can achieve both an increase in the area of imaging area, which increases the proportion of the imaging area to the chip size, and a downsizing of the chip.

A solid-state image capture device according to one aspect of the present disclosure includes a first semiconductor substrate including a first connection and a pixel array in which a plurality of pixels are arranged in a matrix, and a second semiconductor substrate that controls the pixel array and includes a second connection and a pad area including a plurality of pad electrodes for making electrical connection to external equipment. Some of the plurality of pad electrodes are a power supply and a ground. The first semiconductor substrate and the second semiconductor substrate are stacked and joined together, with the first connection and the second connection electrically connected to each other. The first semiconductor substrate and the second semiconductor substrate are substantially equal in size. The plurality of pad electrodes are included in only the second semiconductor substrate. The first semiconductor substrate includes a vertical scanner that scans pixel rows in the pixel array. The pixel array and the vertical scanner share the power supply and the ground.

An image capture device according to one aspect of the present disclosure includes the solid-state image capture device described above.

The solid-state image capture device and the image capture device according to the present disclosure can achieve both an increase in the area ratio of imaging area, which increases the proportion of the imaging area of the chip size, and a downsizing of the chip.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, embodiments will be described in detail with reference to the drawings.

Note that each embodiment described below illustrates a generic or specific example of the present disclosure. Therefore, numerical values, shapes, constituent elements, positions of the constituent elements in the arrangement, forms of connection of the constituent elements, and so on in the following embodiments are mere examples and do not intend to limit the scope of the present disclosure. Among the constituent elements described in the following embodiments, those that are not recited in any independent claim, which represents the broadest concept of the present disclosure, are described as optional constituent elements.

Although the solid-state image capture device and the image capture device according to the present disclosure will be described based on embodiments, they are not intended to be limited to the following embodiments. The present disclosure also includes other embodiments implemented by any combination of constituent elements described in the following embodiments, variations obtained by making various modifications conceivable by those skilled in the art to the following embodiments without departing from the scope of the present disclosure, and various devices that incorporate the solid-state image capture device or the image capture device according to the present disclosure.

In the present disclosure described below, a plane direction refers to a direction parallel to the surfaces of substrates including a first semiconductor substrate (first chip), a second semiconductor substrate (second chip), and a third semiconductor substrate (third chip).

Embodiment 1

Figure 1:
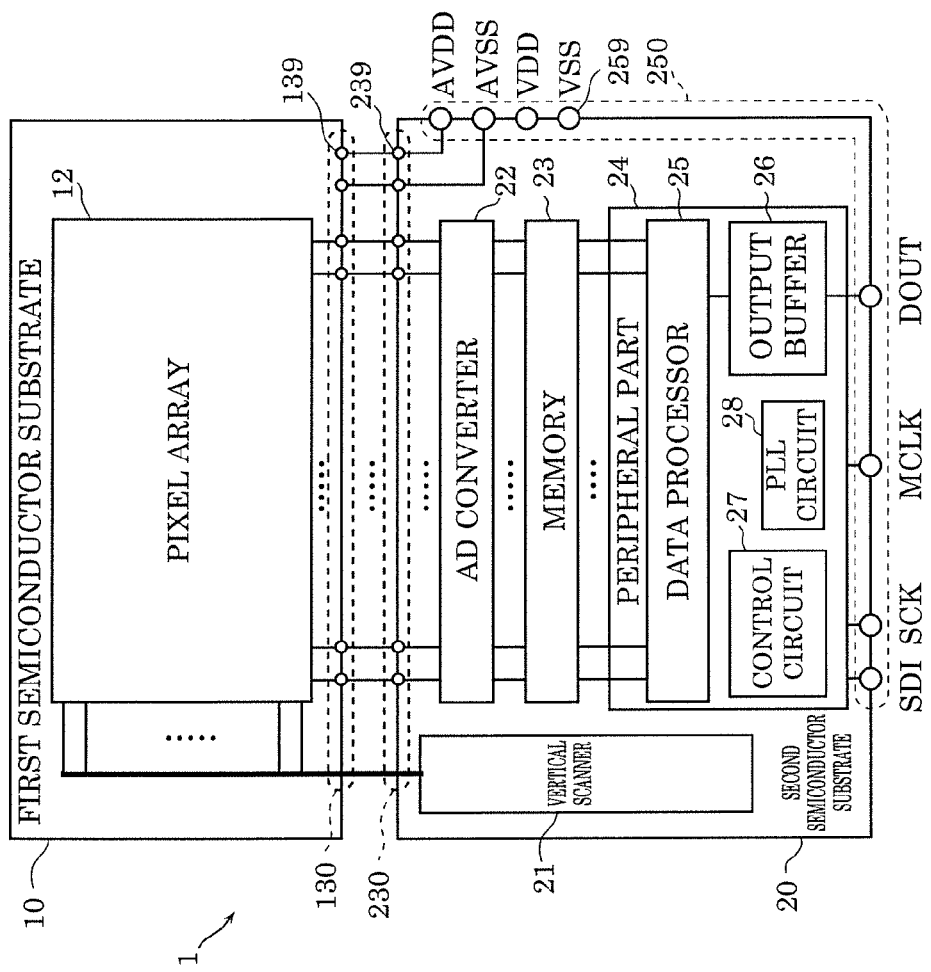
FIG. 1 is a block diagram illustrating a configuration example of a solid-state image capture device according to Embodiment 1.

FIG. 1 is a block diagram illustrating a configuration example of solid-state image capture device 1 according to Embodiment 1.

In FIG. 1, solid-state image capture device 1 includes first semiconductor substrate 10 (also referred to as a first chip) and second semiconductor substrate 20 (also referred to as a second chip). First semiconductor substrate 10 includes pixel array 12 and first connection 130. Second semiconductor substrate 20 includes vertical scanner 21, AD converter 22, memory 23, peripheral part 24, second connection 230, and pad area 250 (also referred to as a PAD).

In first semiconductor substrate 10, pixel array 12 includes a plurality of pixels 11 arranged in a matrix.

First connection 130 includes a plurality of first connection electrodes 139 for transmitting signals received from pixel array 12. First connection electrodes 139 are connected to a rear face out of the two faces (front and rear faces) of first semiconductor substrate 10 so as to oppose the front face of second semiconductor substrate 20. Vertical scanner 21 on second semiconductor substrate 20 scans pixel rows in pixel array 12 on first semiconductor substrate 10.

Vertical scanner 21 outputs an analog signal of pixel data in pixel array 12 to a signal line for each pixel column.

AD converter 22 converts analog signals that are output to pixel columns into digital signals.

Memory 23 temporarily stores digital signals converted by AD converter 22.

Peripheral part 24 includes data processor 25, output buffer 26, control circuit 27, and phase locked loop (PLL) circuit 28.

Data processor 25 converts data stored in memory 23 to optimum data and outputs the converted data with optimum timing to external devices via output buffer 26.

Output buffer 26 outputs data received from data processor 25 to external devices.

Control circuit 27 controls vertical scanner 21, AD converter 22, memory 23, data processor 25, and output buffer 26.

PLL circuit 28 generates an internal reference clock signal on the basis of master clock signal MCLK that is input via pad area 250.

Second connection 230 includes a plurality of second connection electrodes 239.

Second connection electrodes 239 are exposed to the front face out of the two faces (front and rear faces) of second semiconductor substrate 20 so as to oppose the rear face of first semiconductor substrate 10, disposed at positions opposing first connection electrodes 139, and electrically and physically connected to first connection electrodes 139.

Pad area 250 includes a plurality of pad electrodes 259 for electrical connection with external devices.

Each of first connection electrodes 139 and second connection electrodes 239 has a smaller size than pad electrodes 259 in a plan view of solid-state image capture device 1.

First semiconductor substrate 10 and second semiconductor substrate 20 described above have substantially the same size.

First semiconductor substrate 10 and second semiconductor substrate 20 are stacked by electrical connection between first connection 130 and second connection 230. First semiconductor substrate 10 includes no pad electrodes. Note that the substantially the same size may be exactly the same size, or may be any size that is perceived as being the same by the human eye.

Analog power supply AVDD, analog ground AGND, digital power supply VDD, digital ground GND, master clock signal MCLK necessary for PLL circuit 28, and external signals SDI and SCK responsible for controlling solid-state image capture device 1, all being supplied to solid-state image capture device 1, are first supplied to second semiconductor substrate 20 via pad area 250 and then supplied not directly but via second semiconductor substrate 20 to first semiconductor substrate 10 because first semiconductor substrate 10 includes no pad electrodes.

The same applies to other signals, which are not shown above.

Figure 2:
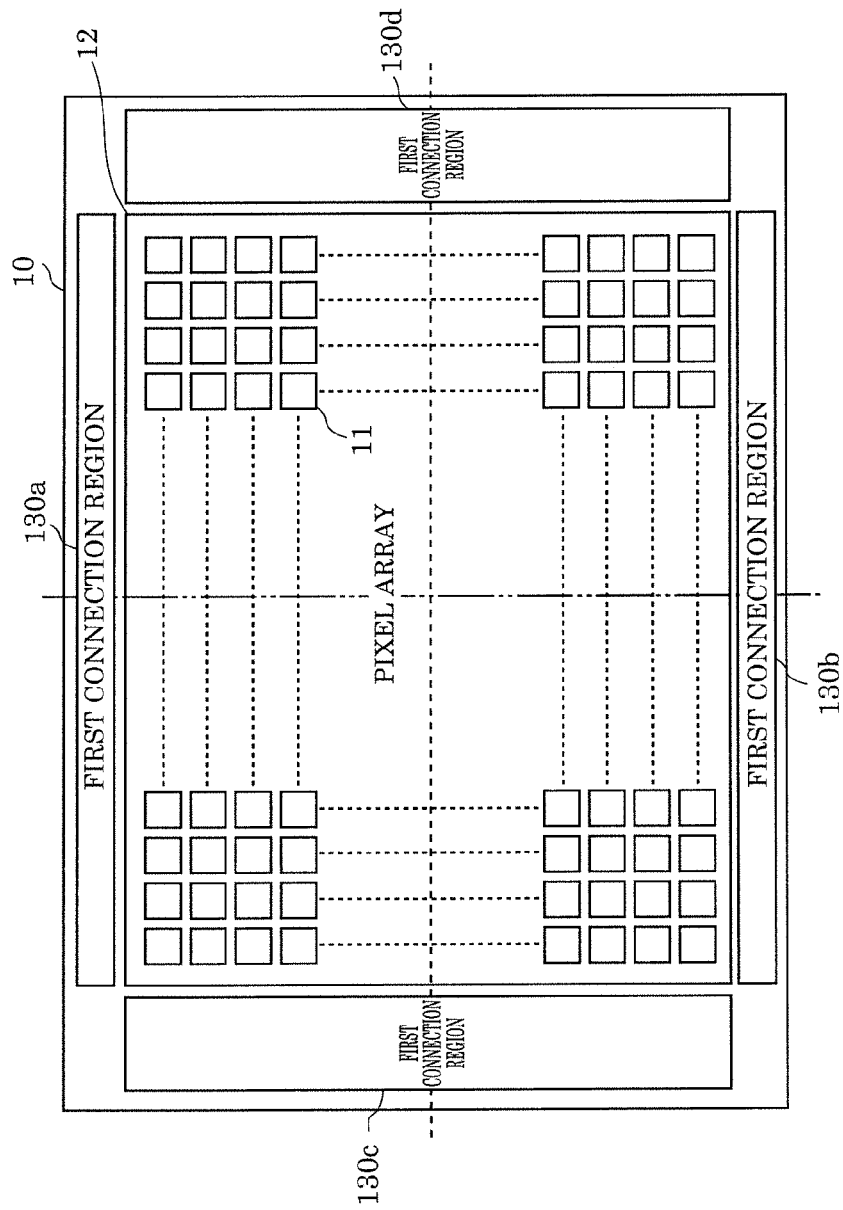
FIG. 2 illustrates layout example 1 of a first semiconductor substrate according to Embodiment 1.

FIG. 2 illustrates layout example 1 of first semiconductor substrate 10 according to Embodiment 1.

In FIG. 2, first semiconductor substrate 10 includes pixel array 12 in which a plurality of pixels 11 are arranged in a matrix, and first connection regions 130a, 130b, 130c, and 130d. In pixel array 12, the alignment of pixels in a row direction, i.e., a lateral direction in FIG. 2, is referred to as a pixel row, and the alignment of pixels in a column direction, i.e., a longitudinal direction in FIG. 2, is referred to as a pixel column.

First connection 130 illustrated in FIG. 1 is divided into and disposed as four first connection regions 130a, 130b, 130c, and 130d. That is, a plurality of first connection electrodes 139 are distributed and disposed in four first connection regions 130a, 130b, 130c, and 130d. Each first connection electrode 139 is formed as a via (also referred to as a VIA) or TSV that is connectable to second connection electrode 239.

In first semiconductor substrate 10, first connection regions 130a, 130b, 130c, and 130d are disposed on edges along the four sides of the first chip. Pixel array 12 is disposed in a region inward of first connection regions 130a, 130c, and 130d.

The most part of first connection regions 130a and 130b includes a group of first connection electrodes 139 that pass the output of each pixel column to second semiconductor substrate 20 and a group of first connection electrodes 139 that receive the power supply and ground of pixel array 12. The most part of first connection regions 130c and 130d includes a group of first connection electrodes 139 that receive signals for controlling each pixel row from second semiconductor substrate 20 and a group of first connection electrodes 139 that receive the power supply and ground of pixel array 12.

Alternatively, the configuration may be such that first connection 130 is divided into at least two regions including one of first connection regions 130a and 130b and one of first connection regions 130c and 130d among first connection regions 130a, 130b, 130c, and 130d.

The number of first connection electrodes 139 disposed in each of first connection regions 130a, 130b, 130c, and 130d may be one or two or more, and any number will do as long as it is physically possible. In the plan view of solid-state image capture device 1, one first connection electrode 139 is much smaller in size than one pad electrode 259 and is thus ignorable. In first connection regions 130a, 130b, 130c, and 130d, functional blocks other than pixels may be disposed in some regions where first connection electrodes 139 are not disposed, i.e., space areas, if these functional blocks can fit in the space areas.

With the above-described configuration, first connection regions 130a, 130b, 130c, and 130d are disposed on the edges of first semiconductor substrate 10, and pad electrodes 259 that are electrically connectable to external devices are eliminated from first semiconductor substrate 10. This enables increasing the proportion of the pixel array to the chip size, achieving both an increase in the area ratio of imaging area and a downsizing of the chip, and increasing the number of pixels 11 arranged in pixel array 12.

Figure 3:
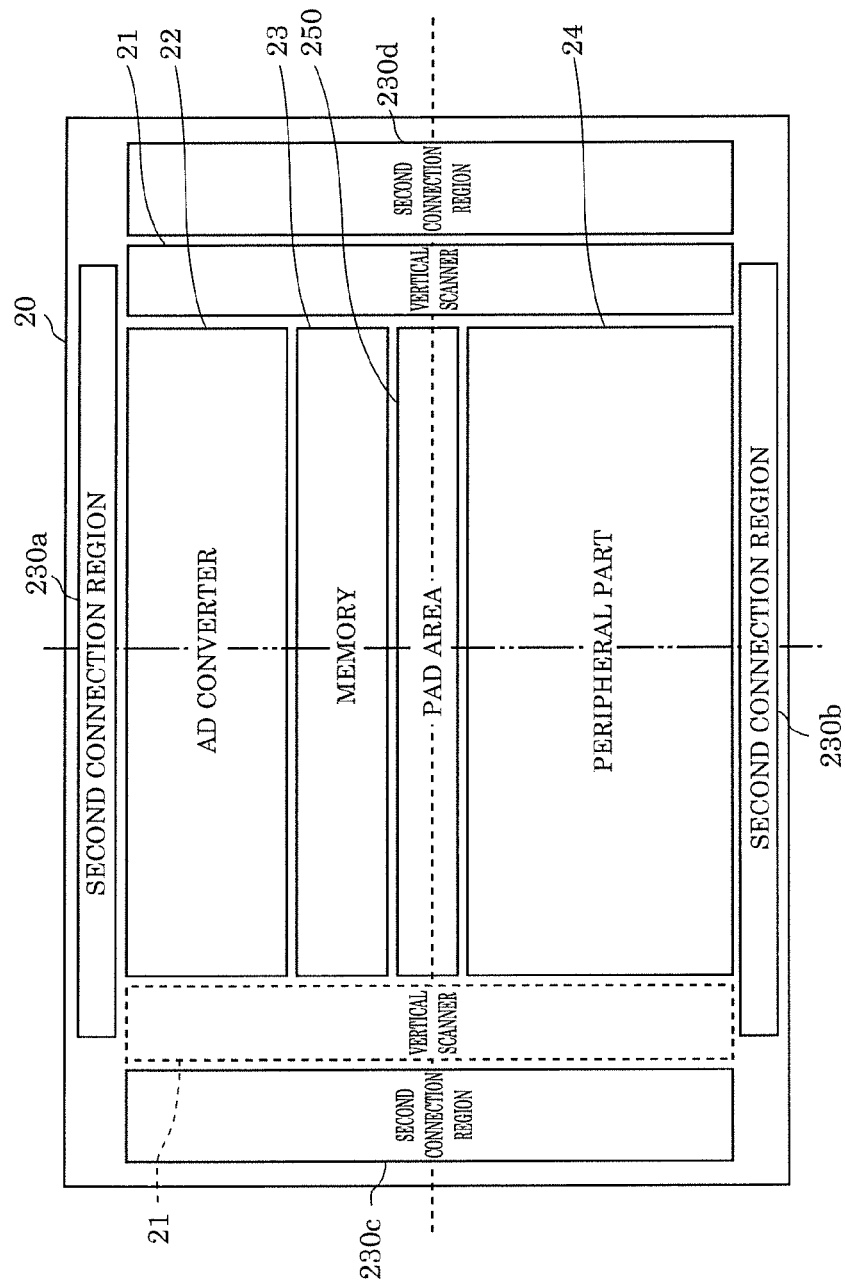
FIG. 3 illustrates layout example 1 of a second semiconductor substrate according to Embodiment 1.

FIG. 3 illustrates layout example 1 of second semiconductor substrate 20 according to Embodiment 1.

In FIG. 3, second semiconductor substrate 20 includes vertical scanner 21, AD converter 22, memory 23, peripheral part 24, pad area 250, and second connection regions 230a, 230b, 230c, and 230d.

Second connection 230 illustrated in FIG. 1 is divided into four second connection regions 230a, 230b, 230c, and 230d. That is, a plurality of second connection electrodes 239 are distributed and disposed in four second connection regions 230a, 230b, 230c, and 230d. Each second connection electrode 239 is formed as a VIA or TSV that is connectable to first connection electrode 139.

Alternatively, the configuration may be such that second connection 230 is divided into at least two regions including one of second connection regions 230a and 230b and one of second connection regions 230c and 230d among second connection regions 230a, 230b, 230c, and 230d.

The number of second connection electrodes 239 disposed in second connection regions 230a, 230b, 230c, and 230d may be any number as long as the second connection electrodes are connectable to first semiconductor substrate 10. In the plan view of solid-state image capture device 1, one second connection electrode 239 is much smaller in size than one pad electrode 259 and is thus ignorable. In second semiconductor substrate 20, vertical scanner 21, AD converter 22, memory 23, peripheral part 24, and pad area 250 are disposed in a region inward of second connection regions 230a, 230b, 230c, and 230d.

Vertical scanner 21 may be disposed on either one of the side closer to second connection region 230c and the side closer to second connection region 230d, or one vertical scanner 21 may be disposed on each of the side closer to second connection region 230c and the side close to second connection region 230d. In the case where one vertical scanner 21 is disposed on each side, two vertical scanners 21 are assumed to have the same configuration. In this case, scanning signals having the same timing may be supplied from the right and left sides to a plurality of pixel rows in pixel array 12. In that case, the left side of pixel array 12 receives a supply of scanning signals from left vertical scanner 21 in FIG. 3 via second connection region 230c and first connection region 130c, and the right side of the plurality of pixel rows receives a supply of scanning signals from right vertical scanner 21 in FIG. 3 via second connection region 230d and first connection region 130d. This suppresses, for example, a difference in voltage drop of scanning signals between the right and left ends of the pixel rows.

In second semiconductor substrate 20, AD converter 22 is disposed either on the side close to second connection region 230a or on the side close to second connection region 230b. Memory 23 is adjacent to AD converter 22 and disposed in a region inward of AD converter 22. In the case where AD converter 22 is disposed adjacent to second connection region 230a, peripheral part 24 is disposed on the side close to second connection region 230b. In the case where AD converter 22 is disposed adjacent to second connection region 230b, peripheral part 24 is disposed on the side close to second connection region 230a. Note that part of peripheral part 24 is disposed in space areas of second semiconductor substrate 20. Pad area 250 is adjacent to memory 23 and peripheral part 24 and disposed in the vicinity of the center of the chip. Pad electrodes 259 are disposed so as to be exposed to the rear face of second semiconductor substrate 20. In other words, pad electrodes 259 are disposed so as to be exposed to a face (rear face) that does not oppose first semiconductor substrate 10, out of the two faces (front and rear faces) of second semiconductor substrate 20. For example, in the case where there exist 10 pads in total including two power supplies, two grounds, and six external signals, the number of pad electrodes 259 disposed in pad area 250 may be 10, which may be disposed in the vicinity of the center of the chip. Including 10 pad electrodes 259 is merely one example. The number of pad electrodes 259 is not limited to 10, and the number of pad electrodes 259 to be disposed may be any number as necessary.

Figure 4:
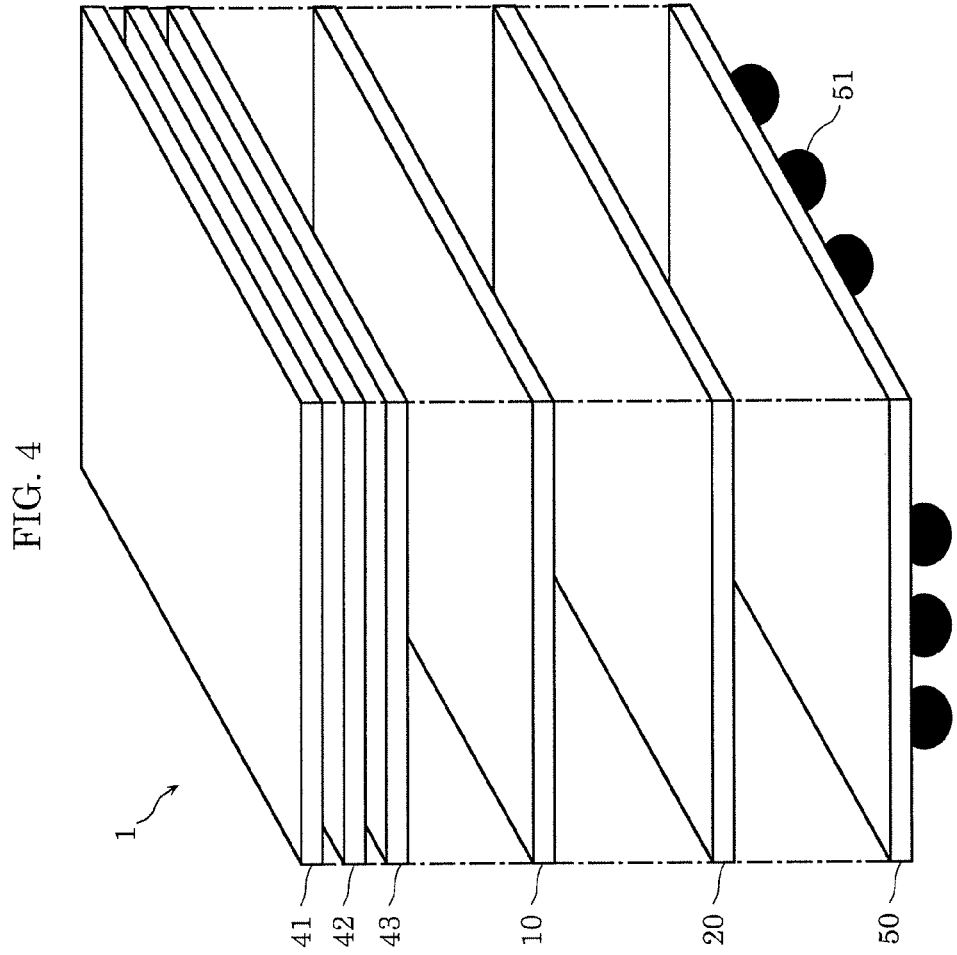
FIG. 4 is an exploded perspective view of a package configuration example of the solid-state image capture device according to Embodiment 1.

FIG. 4 is an exploded perspective view illustrating a package configuration example of solid-state image capture device 1 according to Embodiment 1.

In FIG. 4, solid-state image capture device 1 includes cover plate 41, top lens layer 42, color filter layer 43, first semiconductor substrate 10, second semiconductor substrate 20, and mount board 50. Cover plate 41, top lens layer 42, color filter layer 43, first semiconductor substrate 10, second semiconductor substrate 20, and mount board 50 have substantially the same size and are stacked one above another from top to bottom in the order mentioned.

Mount board 50 is stacked under second semiconductor substrate 20 and includes a plurality of solder balls 51 on the rear face.

Note that a transparent step-height adjustment layer may be provided as means for cancelling out a difference in step height between when color filter layer 43 is provided and when color filter layer 43 is not provided.

The details of the sectional structure of solid-state image capture device 1 in FIG. 4 will be described specifically.

Figure 5:
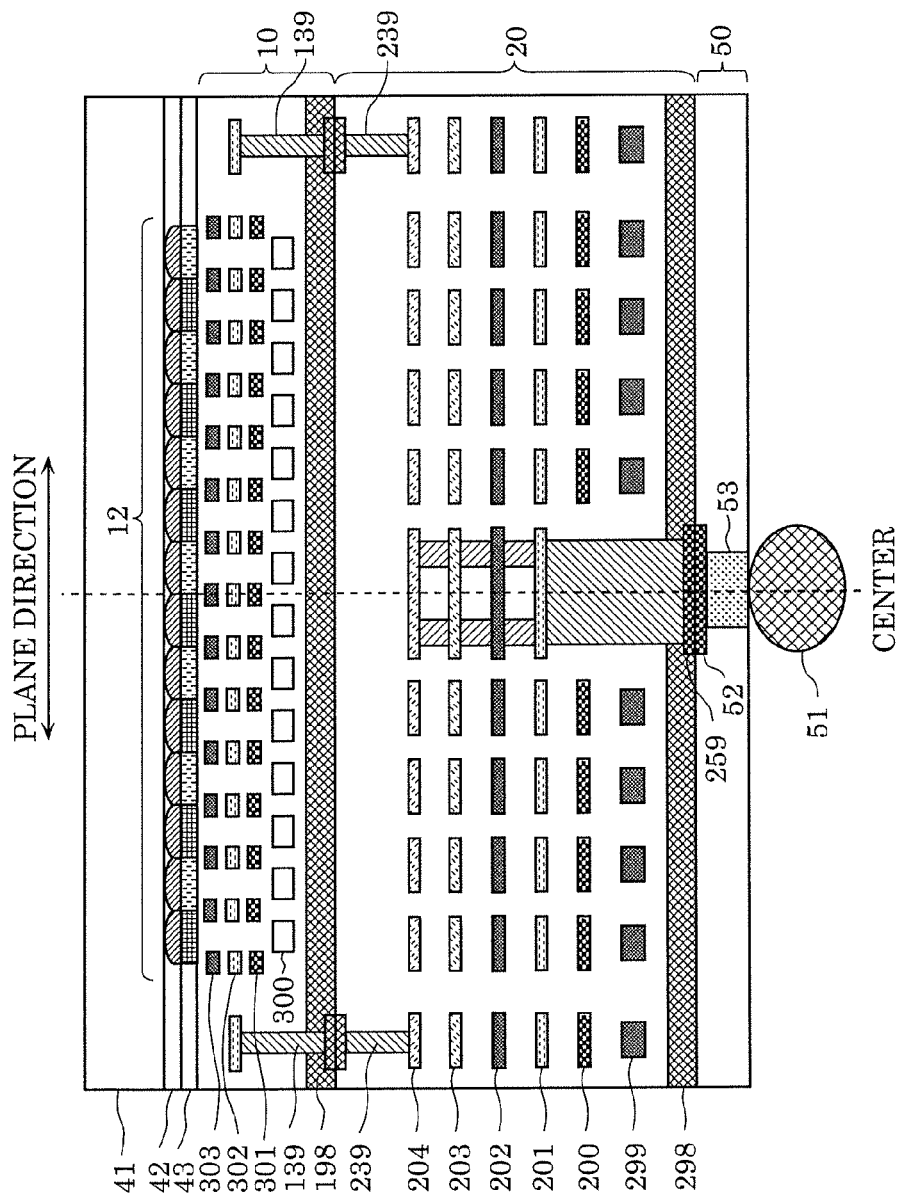
FIG. 5 illustrates a sectional structure example of the solid-state image capture device according to Embodiment 1.

FIG. 5 illustrates an example of the sectional structure of the solid-state image capture device according to Embodiment 1. FIG. 5 shows an example of the sectional structure taken along a chain double-dashed line in FIGS. 2 and 3.

In FIG. 5, cover plate 41 is disposed in the uppermost surface, top lens layer 42 is disposed under cover plate 41, and color filter layer 43 is disposed under top lens layer 42 on first semiconductor substrate 10.

Cover plate 41 is a transparent plate having high light conductivity and located in the uppermost surface, and it is made of, for example, glass or resin.

Top lens layer 42 is stacked under cover plate 41 and includes a plurality of micro-lenses corresponding to the plurality of pixels 11. Each micro-lens collects incident light to the corresponding pixel 11.

Color filter layer 43 is stacked under top lens layer 42 and includes a plurality of color filters corresponding to the plurality of pixels 11. Each color filter corresponds to one of R, G, and B colors, or another color.

First semiconductor substrate 10 is stacked under color filter layer 43. First connection electrodes 139 that configure first connection 130 are formed in a peripheral region of first semiconductor substrate 10, and pixel array 12 is formed in a region inward of the peripheral region.

In the region of first semiconductor substrate 10 where pixel array 12 is formed, a plurality of photodiodes 300 for photoelectric conversion, a plurality of gates 301 for controlling the plurality of photodiodes 300, and a plurality of first lines 302 and a plurality of second lines 303 for controlling gates 301 are formed on silicon substrate 198. The region where pixel array 12 is formed also includes vias that appropriately connect gates 301, first lines 302, and second lines 303.

In the peripheral region of first semiconductor substrate 10, first connection electrodes 139 are formed as vias (VIAS) or TSVs. Here, VIAS are electrodes formed to connect lines in different interconnection layers in the vertical direction. The interconnection layers include an interconnection layer inside the silicon substrate, an interconnection layer on the front face of the silicon substrate, and an interconnection layer on the rear face of the silicon substrate. The silicon substrate as used herein corresponds to first semiconductor substrate 10 or second semiconductor substrate 20.

Through-silicon vias (TSVs) are a type of vias called silicon-through electrodes or silicon-through lines. TSVs are produced using known technology. In the specification of the present disclosure, TSVs do not necessarily have to penetrate the silicon substrate from the front face to the rear face, and may be vias that connect the front or rear face of the silicon substrate to the interconnection layer inside the silicon substrate. First connection electrodes 139 in FIG. 5 are each configured of three parts. The first part is a line or electrode that is formed in the interconnection layer on the face opposing second semiconductor substrate 20, out of the two faces of first semiconductor substrate 10. The second part is a line or electrode that is formed in the interconnection layer inside first semiconductor substrate 10. The third part is a via or TSV that connects the lines or electrodes of the first and second parts. First connection electrodes 139 are exposed to the face opposing second semiconductor substrate 20, out of the two faces of first semiconductor substrate 10, and are electrically and physically connected to second connection electrodes 239 on second semiconductor substrate 20.

Second semiconductor substrate 20 is stacked under first semiconductor substrate 10. In second semiconductor substrate 20, a plurality of diffusion layers 299, which are indispensable for controlling functional blocks that configure vertical scanner 21, AD converter 22, memory 23, and peripheral part 24; a plurality of gates 200 that control diffusion layers 299; a plurality of gates 200 for controlling diffusion layers 299; a plurality of first lines 201 for controlling gates 20; a plurality of second lines 202; a plurality of third lines 203; and a plurality of fourth lines 204 are disposed uniformly over the chip of silicon substrate 298. In the peripheral region of second semiconductor substrate 20, second connection electrodes 239 that configure second connection 230 are formed as vias or TSVs. Second connection electrodes 239 in FIG. 5 are each configured of three parts. The first part is a line or electrode that is formed in the interconnection layer on the face opposing first semiconductor substrate 10, out of the two faces of second semiconductor substrate 20. The second part is a line or electrode that is formed in the interconnection layer inside second semiconductor substrate 20. The third part is a via or TSV that connects the lines or electrodes of the first and second parts. Second connection electrodes 239 are exposed to the face opposing first semiconductor substrate 10, out of the two faces of second semiconductor substrate 20, and are electrically and physically connected to first connection electrodes 139 on first semiconductor substrate 10.

In the region of the rear face of second semiconductor substrate 20 including the center, pad electrodes 259 are disposed that configure pad area 250 that electrically connect second semiconductor substrate 20 and mount board 50. Pad electrodes 259 are electrically and physically connected to connection electrodes 52 on mount board 50.

Diffusion layers 299, gates 200, first lines 201, second lines 202, third lines 203, and fourth lines 204 are connected by vias, and pad electrodes 259 are connected by TSVs to first lines 201. Diffusion layers 299, gates 200, first lines 201, second lines 202, third lines 203, and fourth lines 204, excluding those that are provided above pad electrodes 259, are stacked one above another in the order mentioned within the chip.

Mount board 50 is disposed under second semiconductor substrate 20. Mount board 50 is stacked under second semiconductor substrate 20 and has a plurality of solder balls 51 on the rear face. In mount board 50, connection electrodes 52 connected to second semiconductor substrate 20 are disposed in the vicinity of the center of the chip. Mount board 50 further includes lines 53 for connecting connection electrodes 52 to solder balls 51 disposed on the rear face. Lines 53 in FIG. 5 may include silicon-through lines (TSVs) that penetrate mount board 50 from the front face to the rear face.

In the case of bonding first semiconductor substrate 10 and second semiconductor substrate 20, for example, adhesive bonding or plasma activated bonding in which the surface of a substrate is activated with plasma (subjected to plasma treatment) for bonding may be used.

With the above-described configuration, pad area 250 is disposed on second semiconductor substrate 20, and first semiconductor substrate 10 includes no pad electrodes. This enables increasing the number of pixels and thereby increasing the area ratio of imaging area. Also, solid-state image capture device 1 includes first semiconductor substrate 10 and second semiconductor substrate 20. This prevents noise generated in second semiconductor substrate 20 from propagating into first semiconductor substrate 10, and suppresses noise such as random noise.

In second semiconductor substrate 20, pad electrodes 259 are disposed in the vicinity of the center of second semiconductor substrate 20, instead of being distributed and disposed along the four sides, i.e., top, bottom, right, and left sides. The number of pad electrodes 259 can be reduced by, for example, disposing a plurality of power supplies and a plurality of grounds together, and this achieves a downsizing of the chip.

Solid-state image capture device 1 including cover plate 41, top lens layer 42, color filter layer 43, first semiconductor substrate 10, second semiconductor substrate 20, and mount board 50 can achieve a reduction in size including packaging by using CSP technology using TSVs.

In this way, solid-state image capture device 1 according to Embodiment 1 described above with reference to the drawings has a configuration that increases the area of pixel array 12 (increasing the number of pixels) and prevents noise generated in second semiconductor substrate 20 from propagating into first semiconductor substrate 10. This enables suppressing noise such as random noise. Moreover, pad electrodes 259, which have conventionally been distributed and disposed on the top, bottom, right, and left sides of first semiconductor substrate 10, can be disposed together on second semiconductor substrate 20 by disposing first connection 130 on the chip edge of first semiconductor substrate 10, disposing second connection 230 on the chip edge of second semiconductor substrate 20, and disposing pad area 250 connectable to external devices in the vicinity of the center or on the lower edge of second semiconductor substrate 20.

This achieves a downsizing of the chip.

Variation 1 of Embodiment 1

Figure 6:
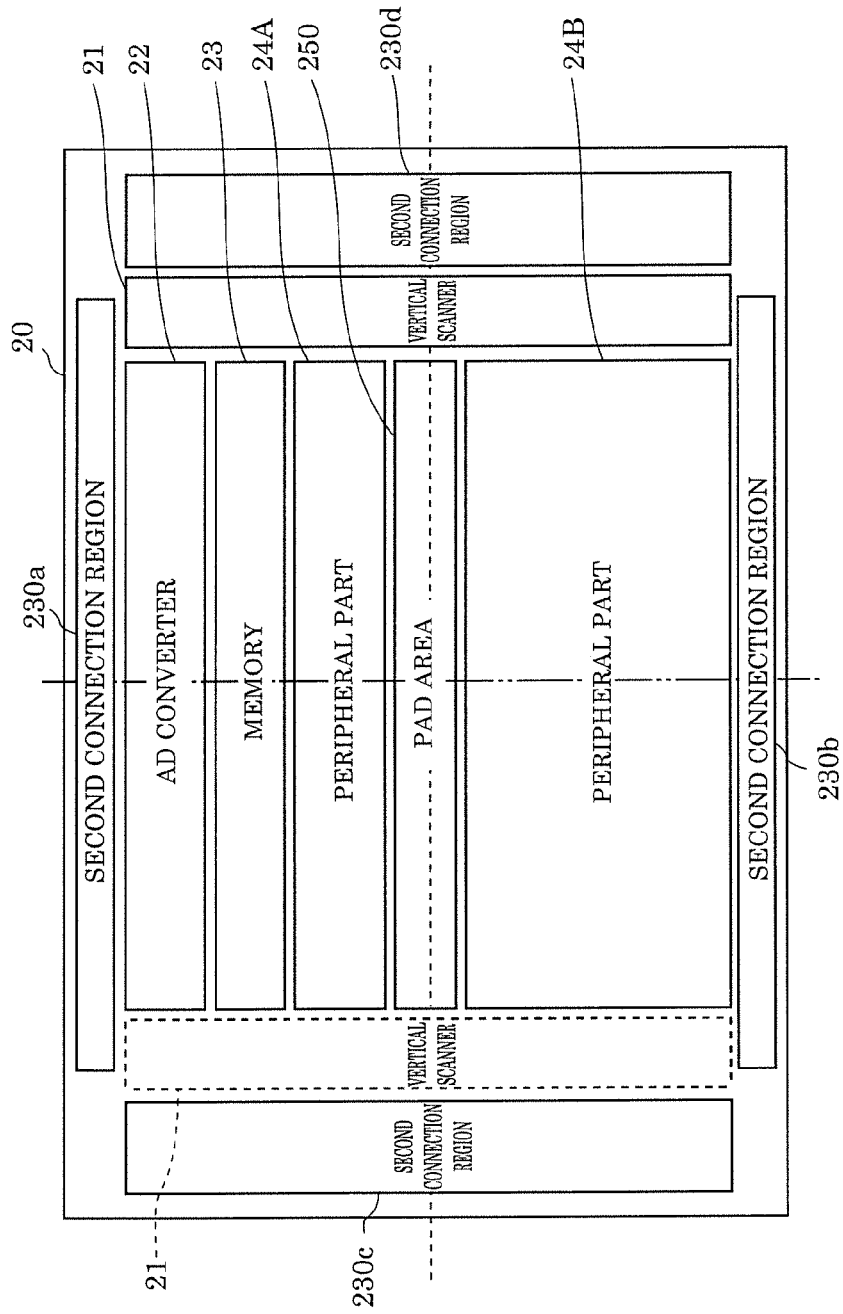
FIG. 6 illustrates layout example 2 of the second semiconductor substrate according to variation 1 of Embodiment 1.

Solid-state image capture device 1 according to variation 1 of Embodiment 1 is the same as the solid-state image capture device illustrated in FIGS. 1, 2, 4, and 5, but differs in the following point. That is, solid-state image capture device 1 according to variation 1 of Embodiment 1 differs in that second semiconductor substrate 20 corresponds to layout example 2 in FIG. 6, instead of the layout example in FIG. 3. The following description focuses on the different point. FIG. 6 illustrates layout example 2 of second semiconductor substrate 20 according to variation 1 of Embodiment 1.

Compared to FIG. 3, second semiconductor substrate 20 in FIG. 6 differs in that two peripheral circuits 24A and 24B are disposed instead of peripheral part 24, and that the region where AD converter 22 and memory 23 are disposed is slightly smaller. Peripheral circuits 24A and 24B are circuits obtained by dividing peripheral circuit 24 into two parts. That is, peripheral circuit 24A corresponds to some circuits in peripheral part 24 in FIG. 3. Peripheral circuit 24B corresponds to the remaining circuits in peripheral part 24. The region where AD converter 22 and memory 23 are disposed is smaller than the region ion FIG. 3, but has the same functionality as that in FIG. 3.

Peripheral circuit 24A is disposed either on the side close to second connection region 230a or on the side close to second connection region 230b, depending on the position of AD converter 22. Peripheral circuit 24A is adjacent to memory 23 and disposed inward of memory 23. Pad area 250 is disposed in the vicinity of the center of the chip and sandwiched between peripheral circuits 24A and 25B.

Due to the relationship that the area of peripheral circuits 24A and 24B is larger than the area of peripheral part 24, individual functional blocks that configure peripheral circuits 24A and 25B are distributed and disposed in peripheral circuits 24A and 24B in order to cancel out an unbalanced heat distribution (heat generated during operations) on the chip. A heat value obtained by adding three heat values of AD converter 22, memory 23, and peripheral circuit 24A is made approximately equal to a heat value of peripheral circuit 24B. Accordingly, heat generation on the chip becomes uniform.

With the above-described configuration, in the case of stacking first semiconductor substrate 10 and second semiconductor substrate 20, uniform heat is generated over second semiconductor substrate 20 in the lower layer, and accordingly first semiconductor substrate 10 in the upper layer receives uniform heat. This eliminates unevenness in the image. That is, quality deterioration of the image can be suppressed.

Variation 2 of Embodiment 1

Solid-state image capture device 1 according to variation 2 of Embodiment 1 is the same as the solid-state image capture device illustrated in FIGS. 1, 2, 4, and 5, but differs in the following point. That is, solid-state image capture device 1 according to variation 2 of Embodiment 1 differs in that second semiconductor substrate 20 corresponds to layout example 3 in FIG. 7, instead of the layout example in FIG. 3. The following description focuses on the different point.

Figure 7:
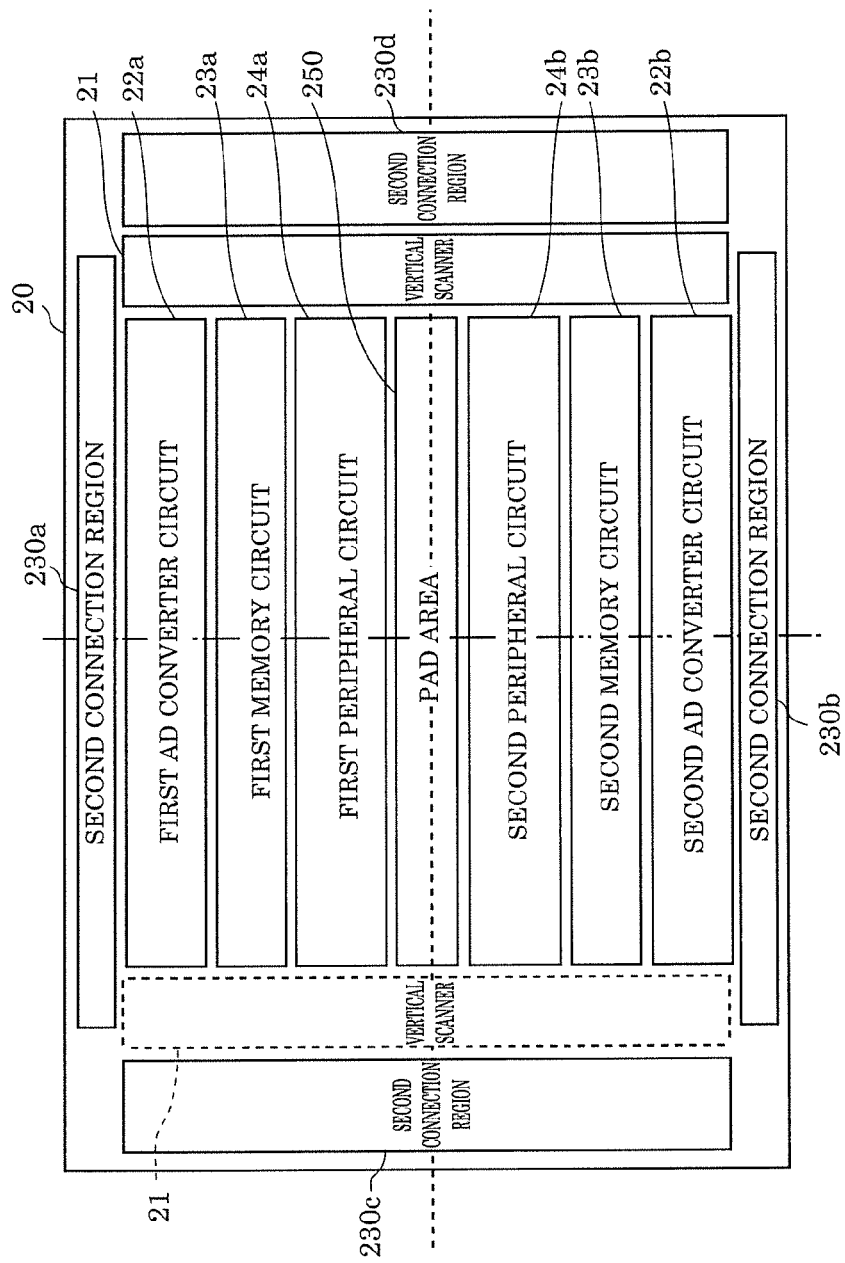
FIG. 7 illustrates layout example 3 of the second semiconductor substrate according to Embodiment 1.

FIG. 7 illustrates layout example 3 of second semiconductor substrate 20 according to variation 2 of Embodiment 1.

Compared to FIG. 3, second semiconductor substrate 20 in FIG. 7 differs in that AD converter 22, memory 23, and peripheral part 24 are each divided into and disposed as two parts. That is, first AD converter circuit 22a and second AD converter circuit 22b are disposed instead of AD converter 22, first memory circuit 23a and second memory circuit 23b are disposed instead of memory 23, and first peripheral circuits 24a and second peripheral circuits 24b are disposed instead of peripheral part 24.

For example, AD converter 22, memory 23, and peripheral part 24 are each divided so as to correspond to a half of the total number of pixel columns in pixel array 12. For example, first AD converter circuit 22a, first memory circuit 23a, and first peripheral circuits 24a correspond to signals of odd-numbered pixel columns, and second AD converter circuit 22b, second memory circuit 23b, and second peripheral circuits 24b correspond to signals of even-numbered pixel columns.

First AD converter circuit 22a, first memory circuit 23a, and first peripheral circuits 24a are disposed in the order mentioned from second connection regions 230a to pad area 250. Similarly, second AD converter circuit 22b, second memory circuit 23b, and second peripheral circuits 24b are disposed in the order mentioned from second connection regions 230b to pad area 250.

First peripheral circuit 24a is adjacent to first memory circuit 23a and disposed inward of first memory circuit 23a on second semiconductor substrate 20. Second peripheral circuit 24b is adjacent to second memory circuit 23b and disposed inward of second memory circuit 23b on second semiconductor substrate 20. Pad area 250 is disposed in the vicinity of the center of the chip so as to be adjacent to and sandwiched between first peripheral circuit 24a and second peripheral circuit 24b.

First AD converter circuit 22a and second AD converter circuit 22b may have the same configuration. First memory circuit 23a and second memory circuit 23b may have same configuration. First peripheral circuit 24a and second peripheral circuit 24b do not necessarily have to have the same configuration.

With the above-described configuration, heat distribution throughout the chip on second semiconductor substrate 20 can be made uniform by disposing the functional blocks with approximately the same configuration so as to be horizontally symmetrical. Accordingly, pixel array 12 on first semiconductor substrate 10 is less affected by the heat generated on second semiconductor substrate 20 in the lower layer, and this reduces unevenness in the image. Moreover, by disposing (installing) AD converters 22 and memories 23 on the top and bottom of the chip, the time of reading out all the pixels can be reduced to a half of that in conventional methods, and the speed of processing can be increased.

As described thus far, solid-state image capture device 1 according to Embodiment 1 includes first semiconductor substrate 10 that includes first connection 130 and pixel array 12 in which the plurality of pixels 11 are arranged in a matrix, and second semiconductor substrate 20 that controls pixel array 12 and includes second connection 230 and pad area 250 including the plurality of pad electrodes 259 for making electrical connection to external devices. First semiconductor substrate 10 and second semiconductor substrate 20 are stacked one above the other by electrical connection between first connection 130 and second connection 230. First semiconductor substrate 10 and second semiconductor substrate 20 have substantially the same size, and first semiconductor substrate 10 includes no pad electrodes.

This configuration increases the proportion of the pixel array to the chip size and achieves both an increase in the area ratio of imaging area and a downsizing of the chip.

Second semiconductor substrate 20 may further include output buffer 26 that outputs data of digital signals (pixel data) obtained by AD converter 22 to external devices, and control circuit 27 that controls output buffer 26. In second semiconductor substrate 20, pad area 250, output buffer 26, and control circuit 27 may be disposed on the side closer to the center than second connection 230 in the plan view of solid-state image capture device 1.

With this configuration, pad electrodes 259 can be disposed together in the vicinity of the center of second semiconductor substrate 20, instead of being distributed and disposed along the four sides of the chip. Accordingly, the chip size can be reduced.

First connection 130 may include the plurality of first connection electrodes 139 that transmit and receive signals to and from pixel array 12, and first connection electrodes 139 may be exposed to the face (rear face) opposing second semiconductor substrate 20, out of the two faces (front and rear faces) of first semiconductor substrate 10. Second connection 230 may include the plurality of second connection electrodes 239, and second connection electrodes 239 may be exposed to the face (front face) opposing first semiconductor substrate 10, out of the two faces (front and rear faces) of second semiconductor substrate 20, disposed at positions opposing first connection electrodes 139, and electrically connected to first connection electrodes 139. Each of first connection electrodes 139 and second connection electrodes 239 may have a smaller size than the pad electrodes in plan view.

First connection electrodes 139 may be distributed and displaced in first connection regions 130a to 130d. First connection regions 130a to 130d may include two or more first connection regions that are formed along two or more sides among the four sides of the first semiconductor substrate in plan view. The number of first connection electrodes 139 may be greater than the a sum of the number of pixel rows and the number of pixel columns in pixel array 12.

The number of first connection electrodes 139 may be greater than the number of pixel columns in pixel array 12.

Second semiconductor substrate 20 may include vertical scanner 21 that scans the pixel rows in pixel array 12, AD converter 22 that convers analog signals received from each pixel column in pixel array 12 into digital signals, output buffer 26 that outputs signals that have undergone AD conversion to external devices via pad area 250, and control circuit 27 that controls vertical scanner 21 and AD converter 22. In second semiconductor substrate 20, vertical scanner 21 and AD converter 22 may be disposed on the side closer to the center than second connection 230 in the plan view.

Pad area 250 may include pad electrodes that receive analog power supply voltage, pad electrodes that receive digital power supply voltage, pad electrodes that are connected to analog ground lines, pad electrodes that are connected to digital ground lines, pad electrodes that receive various control signals for controlling the solid-state image capture device as serial data, pad electrodes that receive a clock signal for defining the timing of serial data, pad electrodes that receive a master clock signal, and pad electrodes that output signals received from the output buffer.

Solid-state image capture device 1 may further include mount board 50 that has substantially the same size as first semiconductor substrate 10 and second semiconductor substrate 20 and has a front face on which second semiconductor substrate 20 is mounted. Mount board 50 may include the plurality of solder balls 51 attached to the rear face of mount board 50, the plurality of connection electrodes 52 exposed to the front face of mount board 50, disposed at positions opposing pad electrodes 259 on second semiconductor substrate 20, and connecting pad electrodes 259, and the plurality of lines 53 connecting connection electrodes 52 and solder balls 51.

Connection electrodes 52 may be disposed in the region of the mount board that includes the center in plan view.

Lines 53 on mount board 50 may include through lines that penetrate mount board 50 from the front face to the rear face.

Connection electrodes 52 on mount board 50 may be pad electrodes.

Solid-state image capture device 1 may further include transparent cover plate 41, top lens layer 42 that is stacked under cover plate 41 and includes a plurality of micro-lenses corresponding to the plurality of pixels 11, and color filter layer 43 that is stacked under top lens layer 42 and includes a plurality of color filters corresponding to the plurality of pixels 11. First semiconductor substrate 10 may be stacked under color filter layer 43. Cover plate 41, top lens layer 42, and color filter layer 43 may have substantially the same size as first semiconductor substrate 10 and second semiconductor substrate 20.

Pad area 250 may be disposed in a region of second semiconductor substrate 20 that includes the center in plan view.

Pad area 250 may be disposed on the rear face of second semiconductor substrate 20.

Embodiment 2

Figure 8:
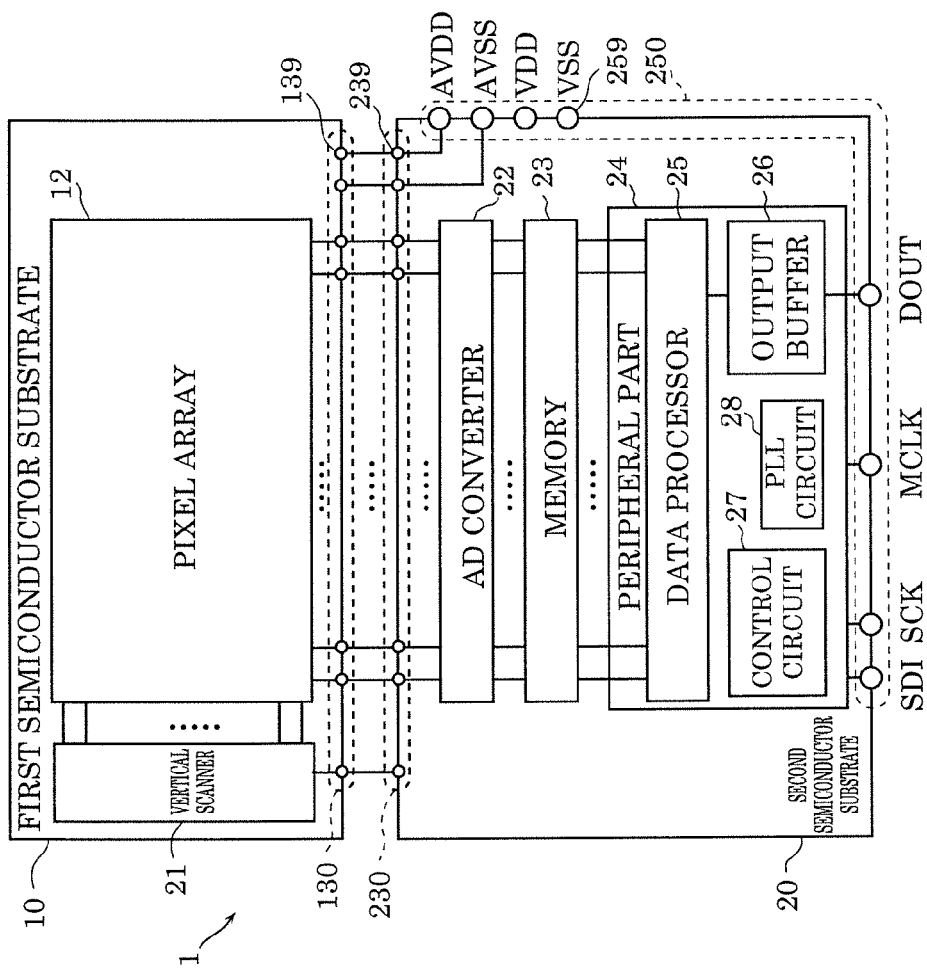
FIG. 8 illustrates a configuration example of a solid-state image capture device according to Embodiment 2.

FIG. 8 illustrates a configuration example of solid-state image capture device 1 according to Embodiment 2. Compared to FIG. 1, solid-state image capture device 1 in FIG. 8 differs in that vertical scanner 21 is included in first semiconductor substrate 10, instead of being included in second semiconductor substrate 20. The following description focuses on the different point.

While vertical scanner 21 according to Embodiment 1 supplies various scanning signals to pixel array 12 via second connection 230 and first connection 130, vertical scanner 21 according to Embodiment 2 supplies various scanning signals directly to pixel array 12. Accordingly, the total number of first connection electrodes 139 in first connection 130 in FIG. 8 is smaller than the total number in FIG. 1. Similarly, the total number of second connection electrodes 239 in second connection 230 in FIG. 8 is smaller than the total number in FIG. 1.

Figure 9:
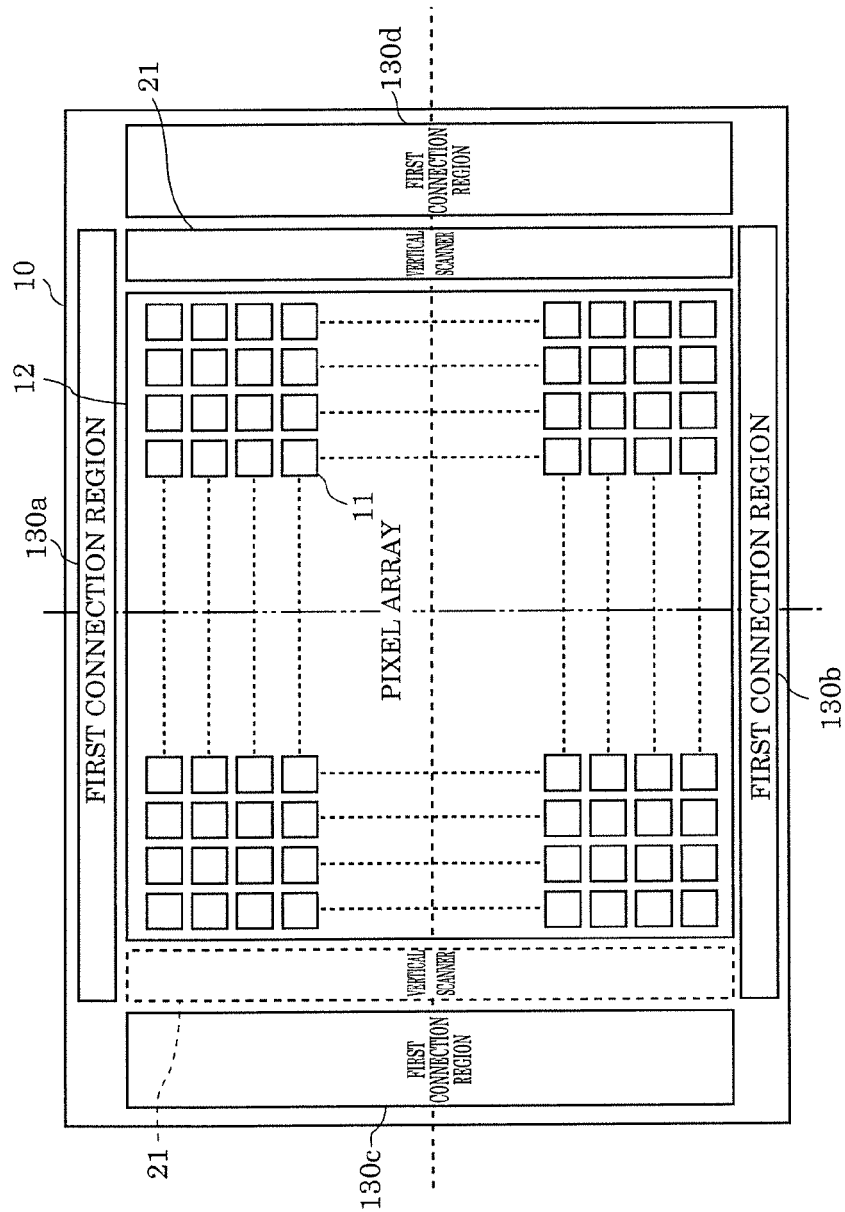
FIG. 9 illustrates layout example 1 of a first semiconductor substrate according to Embodiment 2.

FIG. 9 illustrates layout example 1 of first semiconductor substrate 10 according to Embodiment 2.

Compared to FIG. 2, first semiconductor substrate 10 in FIG. 9 differs in that vertical scanner 21 is additionally provided between first connection region 130c and pixel array 12, and that vertical scanner 21 is additionally provided between first connection region 130d and pixel array 12. The following description focuses on the different points.

Two vertical scanners 21 may have the same configuration and supply various scanning signals to the right and left sides of pixel array 12 with the same timing. Alternatively, the configuration may be such that solid-state image capture device 1 includes one vertical scanner 21.

With the above-described configuration, solid-state image capture device 1 includes vertical scanner(s) 21 and pixel array 12 on the same first semiconductor substrate 10. Vertical scanner(s) 21 and pixel array 12 share the power supply and the ground, i.e., have a common impedance. This allows vertical scanner(s) 21 and each pixel 11 to have the same power supply fluctuations and the same ground fluctuations during the scanning of pixel array 12, thus reducing noise such as random noise or random telegraph signal (RTS) noise.

Figure 10:
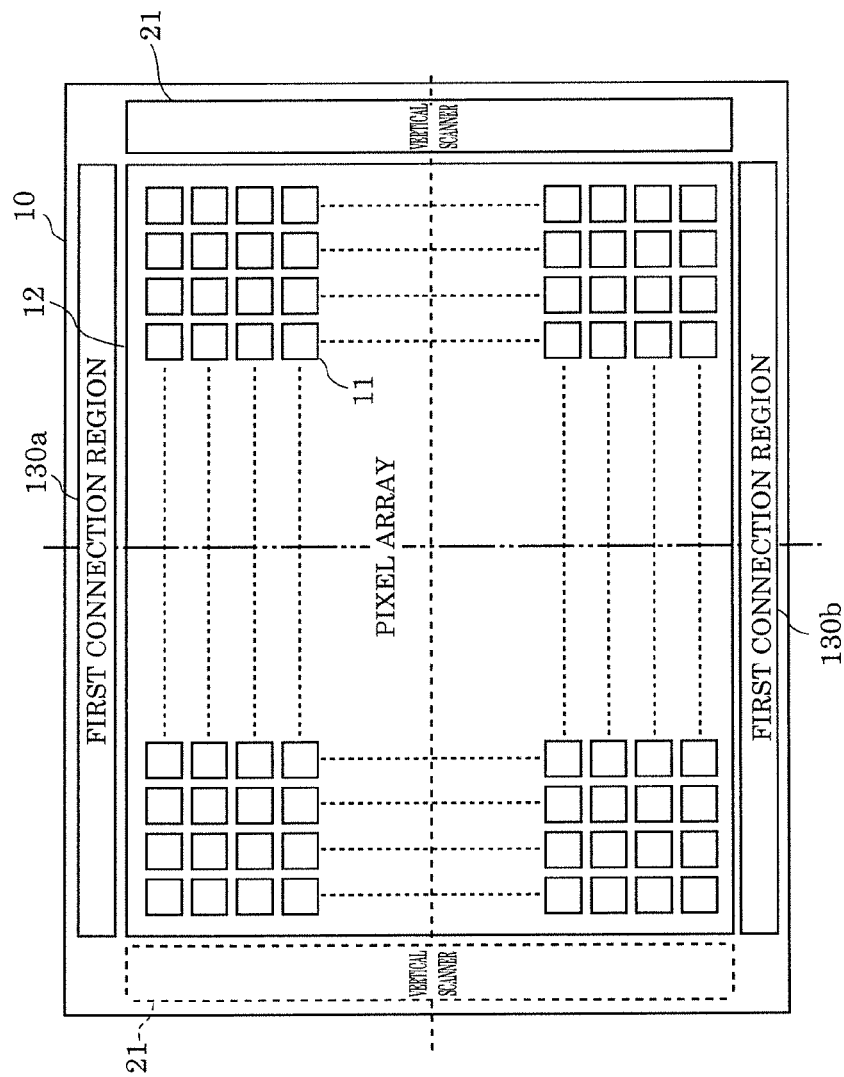
FIG. 10 illustrates layout example 2 of the first semiconductor substrate according to Embodiment 2.

FIG. 10 illustrates layout example 2 of first semiconductor substrate 10 according to Embodiment 2. Compared to FIG. 9, first semiconductor substrate 10 in FIG. 10 primarily differs in that first connection regions 130c and 130d are eliminated. The following description focuses on the different point.

With the elimination of first connection regions 130c and 130d, two vertical scanners 21 are disposed on the sides closer to the edges of first semiconductor substrate 10 than vertical scanners 21 in FIG. 9. This increases the region where pixel array 12 is disposed, to the right and left sides, as compared to the region in FIG. 9.

With the above-described configuration, the region where pixel array 12 is disposed can be increased more than in FIG. 9, and this enables increasing the number of pixels.

Figure 11:
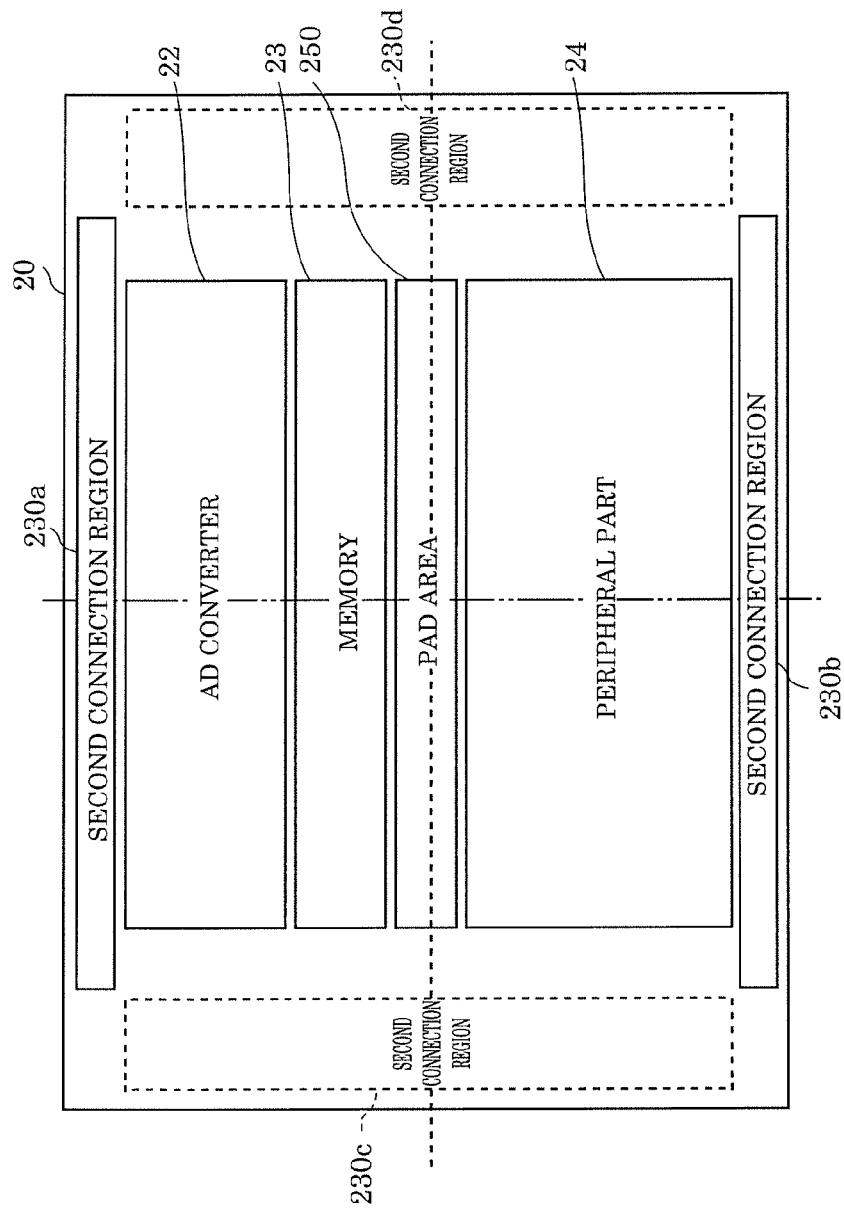
FIG. 11 illustrates layout example 1 of a second semiconductor substrate according to Embodiment 2.

FIG. 11 illustrates layout example 1 of second semiconductor substrate 20 according to Embodiment 2. Compared to FIG. 3, second semiconductor substrate 20 in FIG. 11 differs in that vertical scanner(s) 21 are eliminated. The following description focuses on the different point. In FIG. 11, for example, some functional blocks in peripheral part 24 may be disposed in a space area from which vertical scanner(s) 21 are eliminated.

Figure 12:
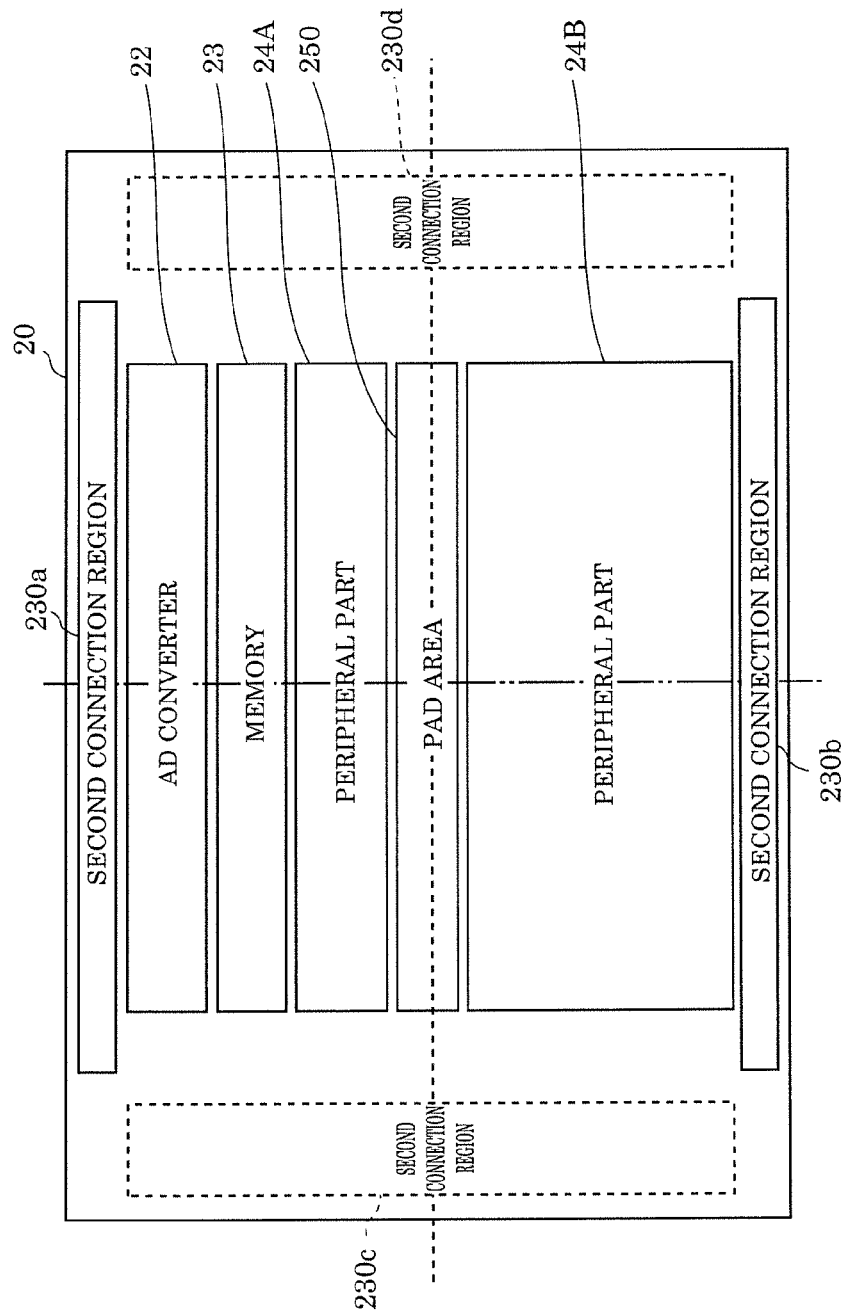
FIG. 12 illustrates layout example 2 of the second semiconductor substrate according to Embodiment 2.

FIG. 12 illustrates layout example 2 of second semiconductor substrate 20 according to Embodiment 2. Compared to FIG. 6, second semiconductor substrate 20 in FIG. 12 differs in that vertical scanner(s) 21 are eliminated. The following description focuses on the different point. In FIG. 12, for example, some functional blocks in peripheral circuit 24A or some functional blocks in peripheral circuit 24B may be disposed in space areas from which vertical scanner(s) 21 are eliminated.

Figure 13:
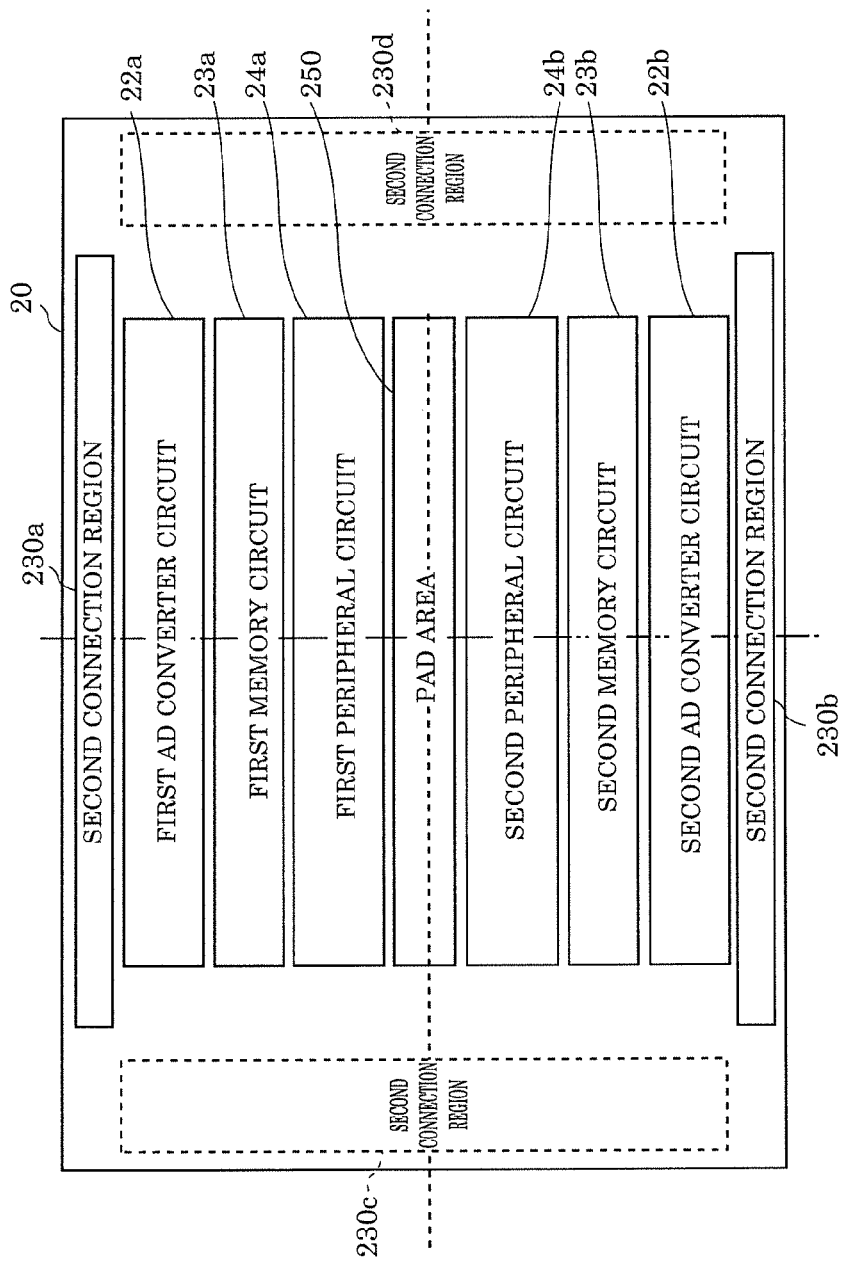
FIG. 13 illustrates layout example 3 of the second semiconductor substrate according to Embodiment 2.

FIG. 13 illustrates layout example 3 of second semiconductor substrate 20 according to Embodiment 2. Compared to FIG. 7, second semiconductor substrate 20 in FIG. 13 differs in that vertical scanner(s) 21 are eliminated. The following description focuses on the different point. In FIG. 13, for example, some functional blocks in first peripheral circuit 24a or some functional blocks in second peripheral circuit 24b can be disposed in space areas from which vertical scanner(s) 21 are eliminated.

In layout examples 1, 2, 3 of second semiconductor substrate 20 illustrated in FIGS. 11, 12, and 13 described above, no vertical scanners 21 are disposed on second semiconductor substrate 20, on the assumption that vertical scanner(s) 21 are disposed on first semiconductor substrate 10 illustrated in FIG. 9 or 10. In FIGS. 11, 12, and 13, solid-state image capture device 1 does not necessarily have to transmit various scanning signals between first connection 130 and second connection 230, and can significantly reduce the total number of first connection electrodes 139 and second connection electrodes 239 as compared with the case in Embodiment 1. As a result, it is possible to eliminate either or both of second connection regions 230c and 230d on second semiconductor substrate 20.

The above-described configuration can suppress heat generation on second semiconductor substrate 20.

As described thus face, in solid-state image capture device 1 according to Embodiment 2 described with reference to the drawings, first semiconductor substrate 10 includes pixel array 12 in which the plurality of pixels 11 are arranged two-dimensionally, vertical scanner(s) 21 that control pixel array 12, and first connection 130 disposed on the chip edge and connecting first semiconductor substrate 10 and second semiconductor substrate 20. Since pixel array 12 and vertical scanner(s) 21 on first semiconductor substrate 10 share the power supply and the ground, main noise such as random noise can be reduced. Also, vertical scanner(s) 21 are disposed, instead of first connection regions 130c and 130d disposed on the right and left chip edges of first semiconductor substrate 10, and the control signals of vertical scanner(s) 21, the power supply, and the ground are received from first connection regions 130a and 130b disposed on the top and bottom edges of the chip. This achieves a downsizing of the chip while suppressing a reduction in the number of pixels. It is also possible to suppress heat generation on second semiconductor substrate 20.

As described above, in solid-state image capture device 1 according to Embodiment 2, first semiconductor substrate 10 includes vertical scanner(s) 21 that scan the pixel rows in pixel array 12, and second semiconductor substrate 20 includes AD converter 22 that converts analog signals received from each pixel column in pixel array 12 into digital signals, output buffer 26 that outputs signals that have undergone AD conversion to external devices via pad area 250, and control circuit 27 that controls AD converter 22. Vertical scanner(s) 21 are disposed on the side closer to the center of first semiconductor substrate 10 than first connection 130 in plan view, and AD converter 22 is disposed on the side closer to the center of second semiconductor substrate 20 than second connection 230 in plan view.

Alternatively, first semiconductor substrate 10 may include vertical scanner(s) 21 that scan the pixel rows in pixel array 12, and second semiconductor substrate 20 may include AD converter 22 that performs AD conversion on signals received from each pixel column in pixel array 12, output buffer 26 that outputs signals that have undergone AD conversion to external devices via pad area 250, and control circuit 27 that controls AD converter 22. Vertical scanner(s) 21 may be disposed on the peripheral side of first semiconductor substrate 10 so as not to overlap with first connection 130 in plan view. Pixel array 12 may be disposed on the side closer to the center of first semiconductor substrate 10 than vertical scanner(s) 21 and first connection 130 in plan view, and AD converter 22 may be disposed on the side closer to the center of second semiconductor substrate 20 than second connection 230 in plan view Embodiment 3

Figure 14:
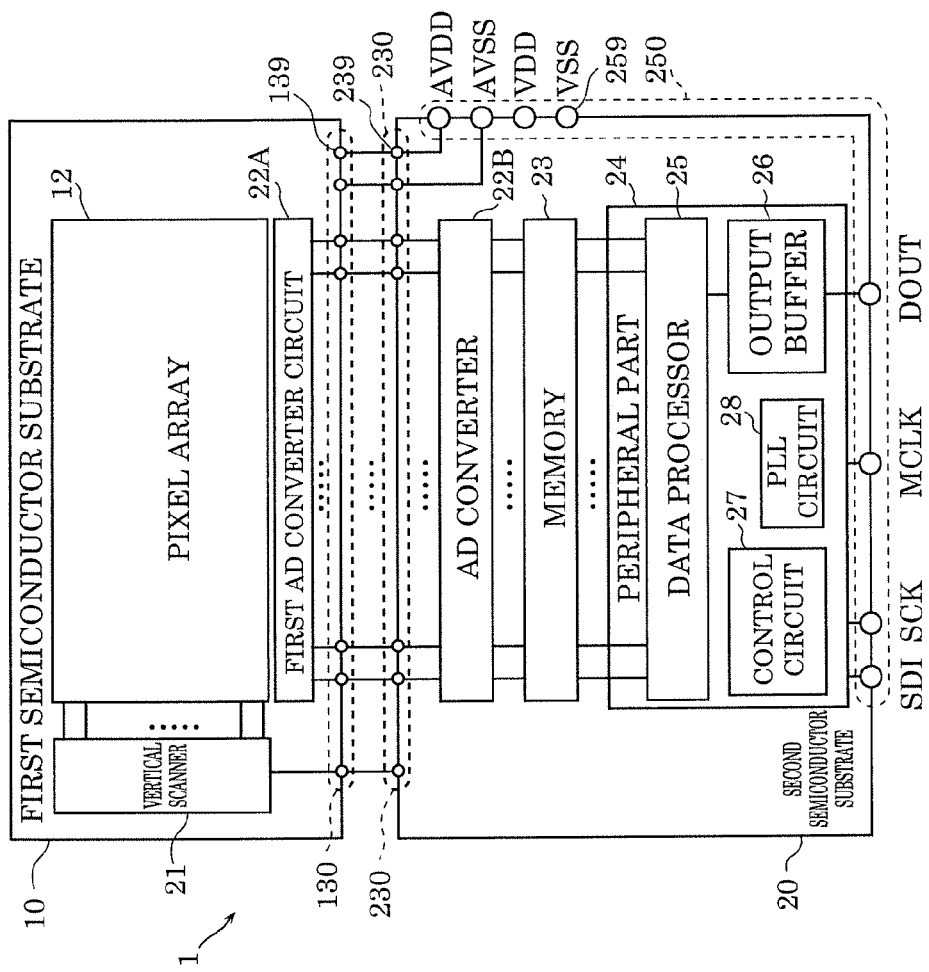
FIG. 14 illustrates a configuration example of a solid-state image capture device according to Embodiment 3.

FIG. 14 illustrates a configuration example of solid-state image capture device 1 according to Embodiment 3. Compared to FIG. 8, solid-state image capture device 1 in FIG. 14 differs in that AD converter 22 is eliminated and that first AD converter circuit 22A and second AD converter circuit 22B are additionally provided. The following description focuses on the different points.

First AD converter circuit 22A and second AD converter circuit 22B are circuits obtained by dividing AD converter 22 into two parts. That is, first AD converter circuit 22A corresponds to some circuits in AD converter 22 in FIG. 8, and second AD converter circuit 22B corresponds to the remaining circuits in AD converter 22.

For example, first AD converter circuit 22A corresponds to some analog functions of AD converter 22 in FIG. 8 and includes constant-current supply circuits for each pixel column, which are necessary to read out signals from pixels 11.

Figure 15:
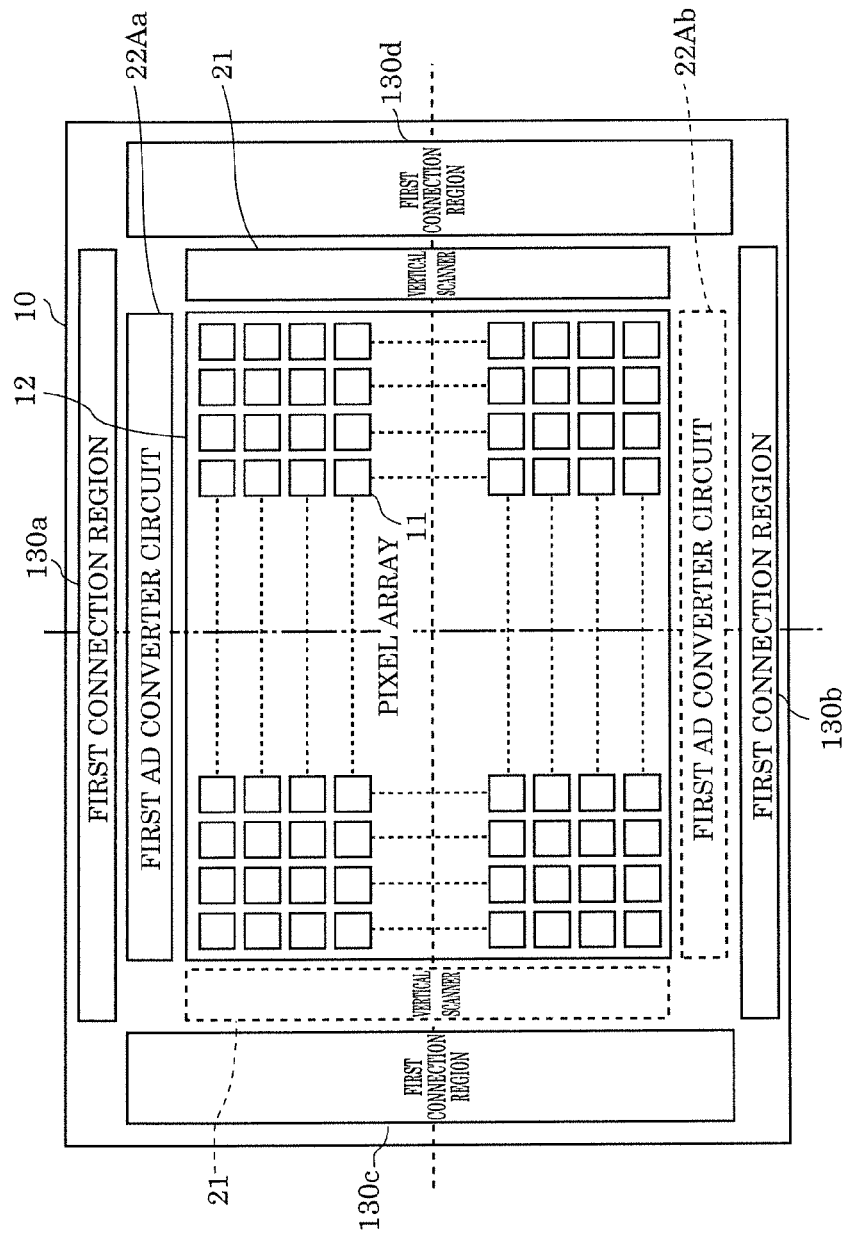
FIG. 15 illustrates layout example 1 of a first semiconductor substrate according to Embodiment 3.

Second AD converter circuit 22B has, for example, a circuit configuration that excludes first AD converter circuit 22A from AD converter 22 in FIG. 8. FIG. 15 illustrates layout example 1 of first semiconductor substrate 10 according to Embodiment 3.

Compared to FIG. 9, first semiconductor substrate 10 in FIG. 15 differs in that first AD converter circuits 22Aa and 22Ab are additionally provided. The following description mainly focuses on the different point.

First AD converter circuits 22Aa and 22Ab are circuits obtained by quantitatively dividing first AD converter circuit 22A in FIG. 14 into two parts. For example, first AD converter circuit 22Aa corresponds to odd-numbered pixel columns, and first AD converter circuit 22Ab corresponds to even-numbered pixel columns. In this case, first AD converter circuits 22Aa and 22Ab have different connection destinations but have the same circuit configuration. More specifically, in the case where first AD converter circuit 22A in FIG. 14 includes n1 constant-current supply circuits, first AD converter circuit 22Aa includes n1/2 constant-current supply circuits, and first AD converter circuit 22Ab includes n1/2 constant-current supply circuits.

If only one of first AD converter circuits 22Aa and 22Ab is included and the other is not included, the one first AD converter circuit has the same circuit configuration as first AD converter circuit 22A.

First AD converter circuits 22Aa and 22Ab may be disposed along any two of four first connection regions 130a, 130b, 130c, and 130d. Alternatively, first AD converter circuits 22Aa to 22Ad obtained by quantitatively dividing first AD converter circuit 22A into four parts may be disposed along four first connection regions 130a, 130b, 130c, and 130d. As another alternative, first AD converter circuits 22Aa to 22Ac obtained by quantitatively dividing first AD converter circuit 22A into three parts may be disposed along any three of first connection regions 130a, 130b, 130c, and 130d.

With the above-described configuration, first AD converter circuits 22Aa and 22Ab and pixel array 12 share the power supply and the ground. This allows first AD converter circuits 22Aa and 22Ab and each pixel 11 to have the same power supply fluctuations and the ground fluctuations during readout of each pixel 11, thus suppressing random noise.

Figure 16:
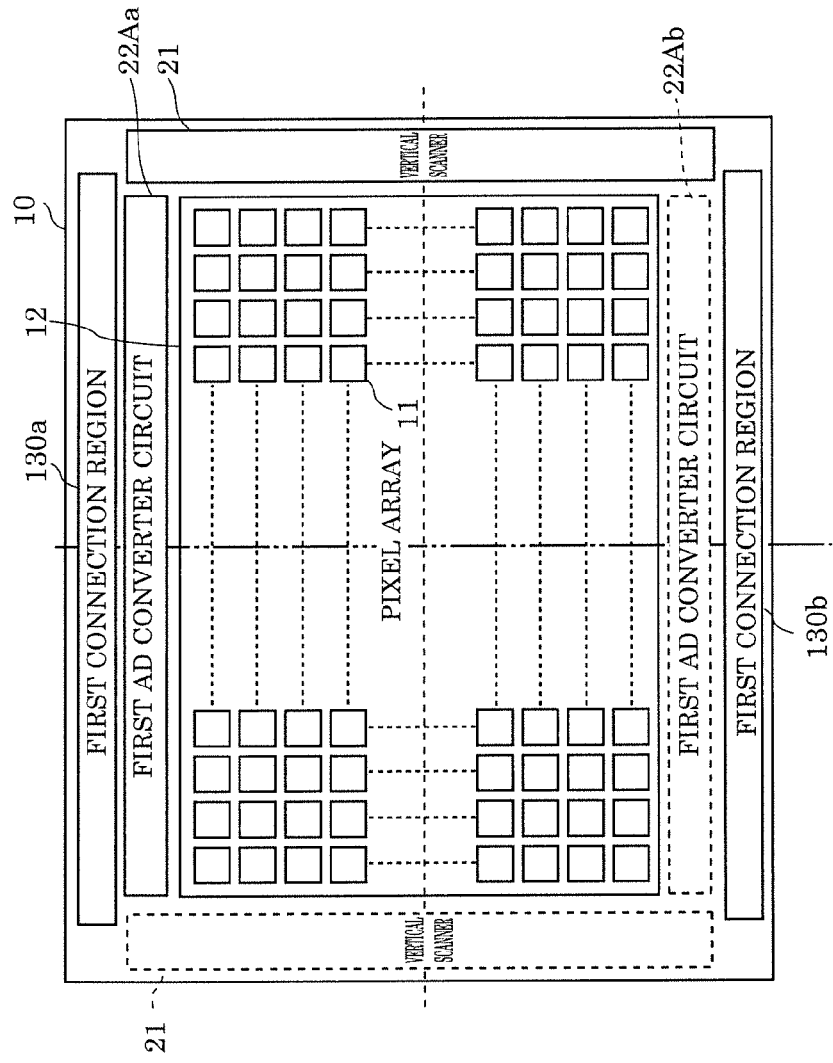
FIG. 16 illustrates layout example 2 of the first semiconductor substrate according to Embodiment 3.

FIG. 16 illustrates layout example 2 of first semiconductor substrate 10 according to Embodiment 3.

Compared to FIG. 15, first semiconductor substrate 10 in FIG. 16 primarily differs in that first connection regions 130c and 130d are eliminated. The following description focuses on the different point.

With the elimination of first connection regions 130c and 130d, two vertical scanners 21 are disposed on the sides closer to the edges of first semiconductor substrate 10 than vertical scanners 21 in FIG. 15. This increases the region where pixel array 12 is disposed, to the right and left sides as compared to the region in FIG. 15.

With the above-described configuration, the region where pixel array 12 is disposed can be increased more than in FIG. 15, and this enables increasing the number of pixels.

Figure 17:
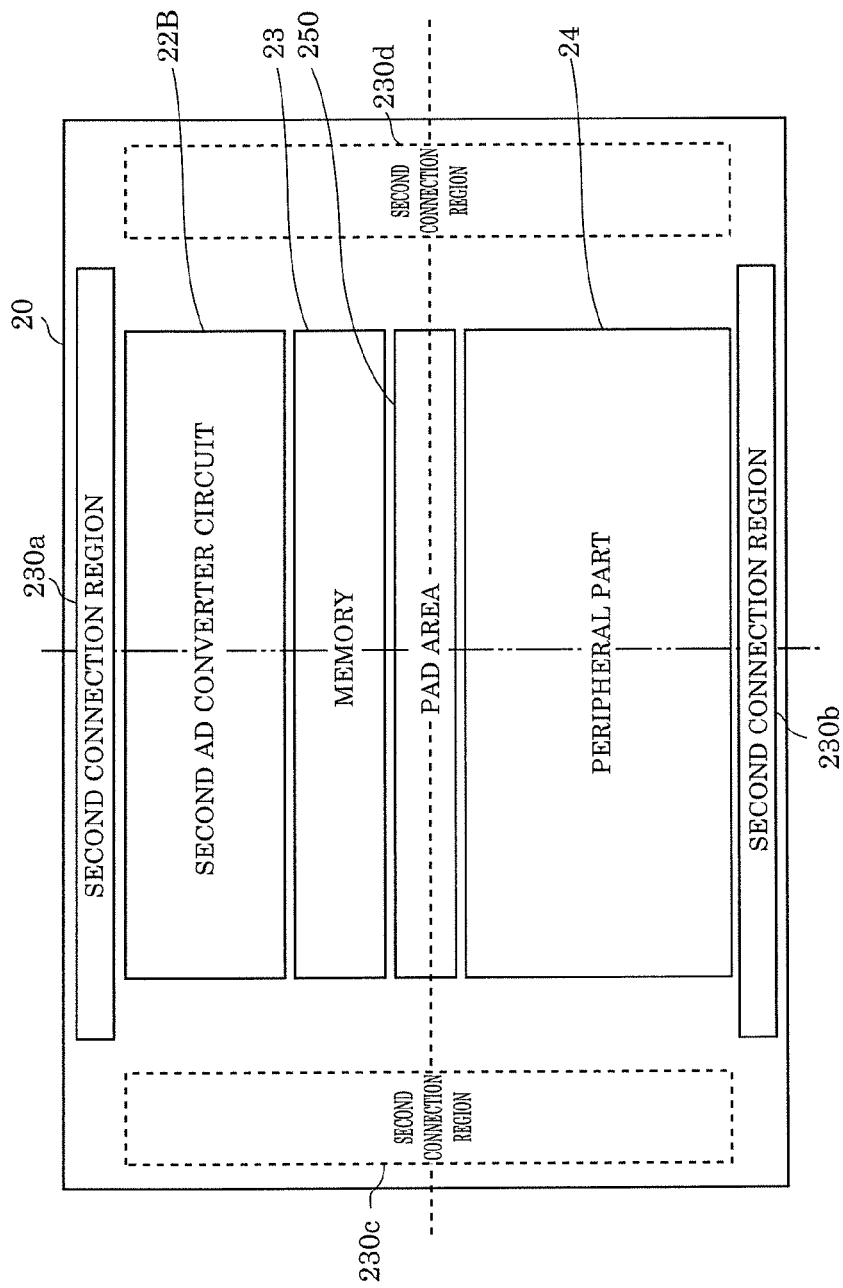
FIG. 17 illustrates layout example 1 of a second semiconductor substrate according to Embodiment 3.

FIG. 17 illustrates layout example 1 of second semiconductor substrate 20 according to Embodiment 3. Compared to FIG. 11, second semiconductor substrate 20 in FIG. 17 differs in that second AD converter circuit 22B is provided, instead of AD converter 22. The following description focuses on the different point.

As described above, second AD converter circuit 22B has a circuit configuration that excludes first AD converter circuit 22A in FIG. 14 from AD converter 22 in FIG. 8. More specifically, in the case where first AD converter circuit 22A includes constant-current supply circuits for each pixel column, second AD converter circuit 22B has a circuit configuration that excludes the constant-current supply circuits for each pixel column from AD converter 22 in FIG. 8.

Figure 18:
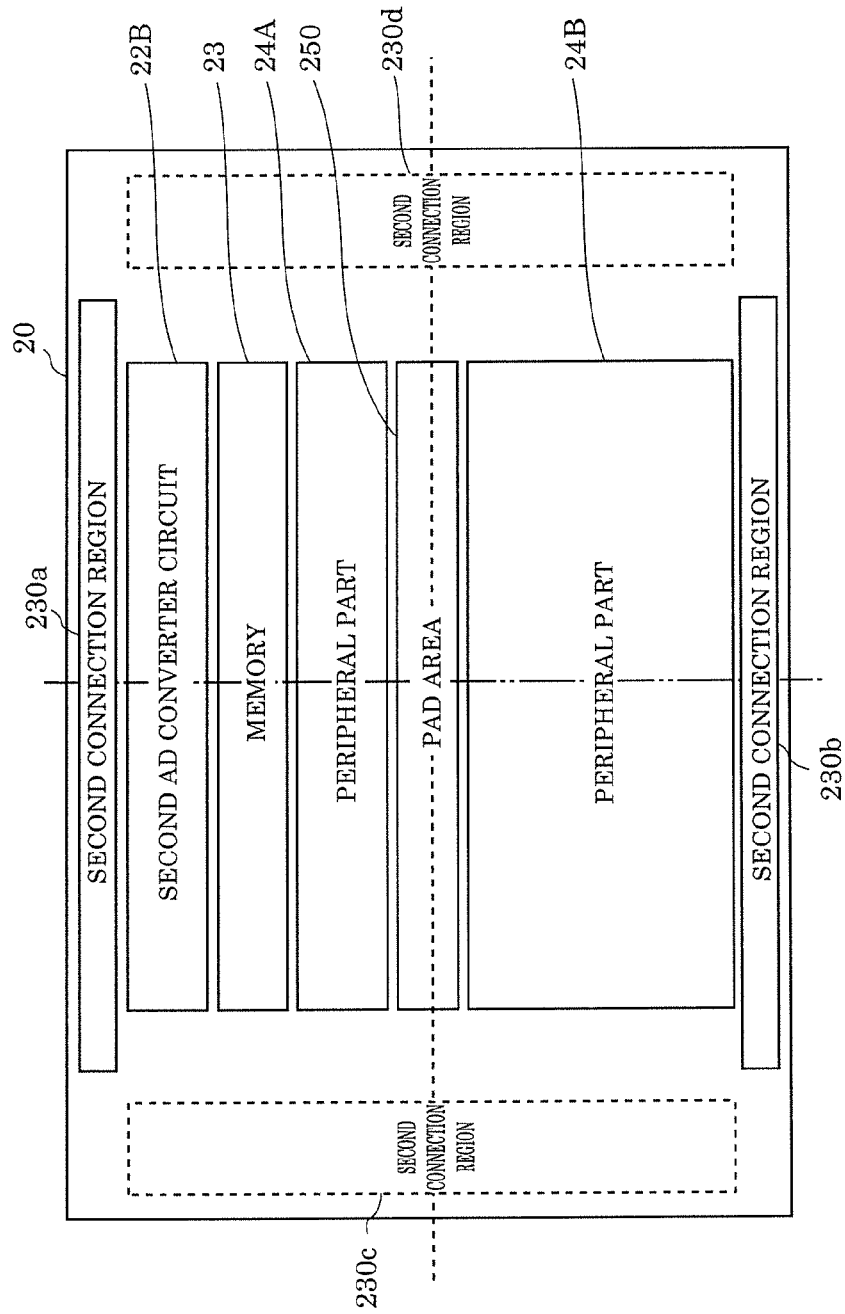
FIG. 18 illustrates layout example 2 of the second semiconductor substrate according to Embodiment 3.

FIG. 18 illustrates layout example 2 of second semiconductor substrate 20 according to Embodiment 3. Compared to FIG. 12, second semiconductor substrate 20 in FIG. 18 differs in that second AD converter circuit 22B is provided, instead of AD converter 22. The following description focuses on the different point.

Second AD converter circuit 22B is as described above with reference to FIG. 17.

Figure 19:
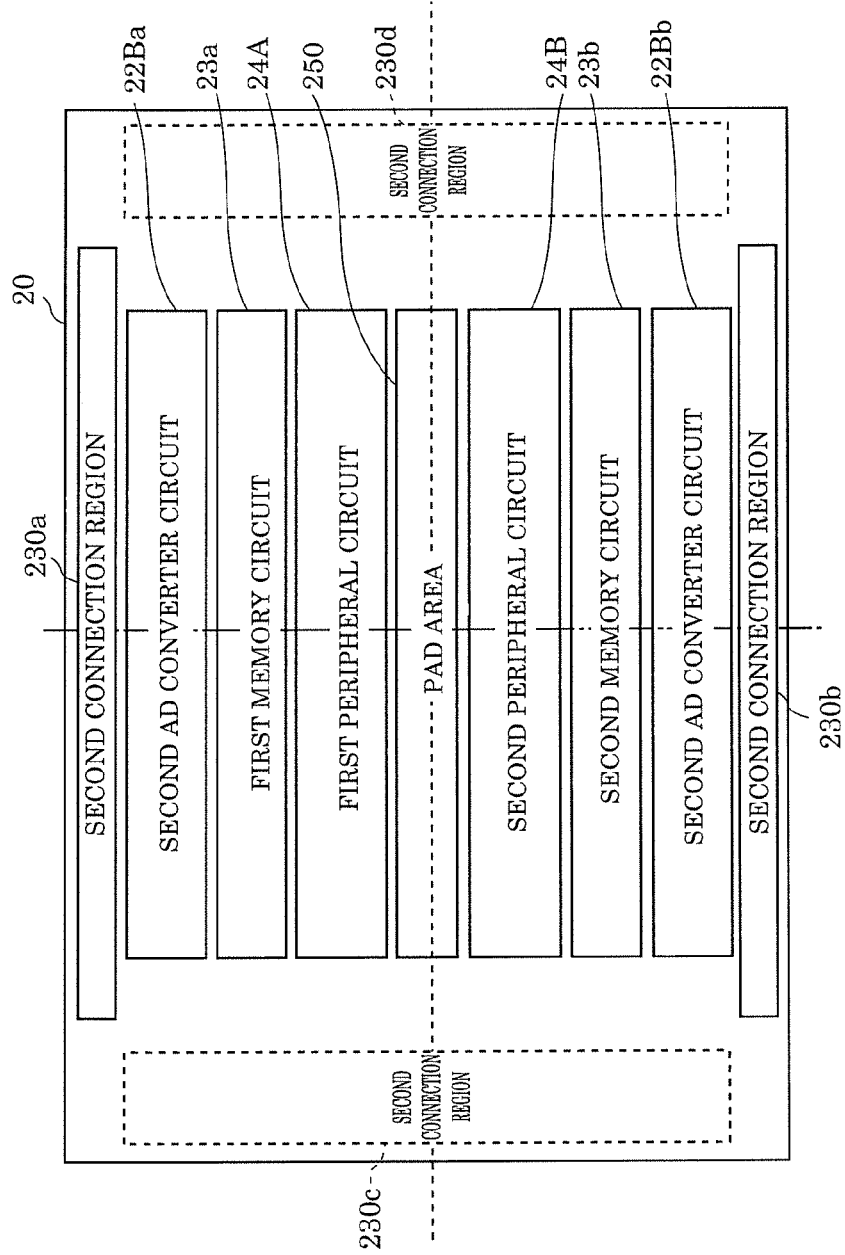
FIG. 19 illustrates layout example 3 of the second semiconductor substrate according to Embodiment 3.

FIG. 19 illustrates layout example 3 of second semiconductor substrate 20 according to Embodiment 3. Compared to FIG. 13, second semiconductor substrate 20 in FIG. 19 differs in that second AD converter circuits 22Ba and 22Bb are provided, instead of first AD converter circuit 22a and second AD converter circuit 22b. The following description focuses on the different point.

Second AD converter circuits 22Ba and 22Bb are circuits obtained by quantitatively dividing second AD converter circuit 22B in FIG. 14 into two parts. For example, second AD converter circuit 22Ba corresponds to odd-numbered pixel columns, and second AD converter circuit 22Bb corresponds to even-numbered pixel columns. In this case, second AD converter circuits 22Ba and 22Bb have different connection destinations but have the same circuit configuration.

In FIGS. 17, 18, and 19 described above, first AD converter circuit 22A having some analog functions among the circuit functions of AD converter 22 is disposed on first semiconductor substrate 10, as compared to that in solid-state image capture device 1 according to Embodiment 2. Therefore, second AD converter circuit 22B that has the remaining AD conversion functions is disposed on second semiconductor substrate 20.

With the above-described configuration, heat generation on second semiconductor substrate 20 can be suppressed by disposing first AD converter circuit 22A on first semiconductor substrate 10. Also, first AD converter circuit 22A disposed on first semiconductor substrate 10 can share the analog ground of the constant-current supply circuits with pixel array 12 and therefore has the same ground fluctuations. This enables suppressing random noise.

In solid-state image capture device 1 according to Embodiment 3 described above with reference to the drawings, first semiconductor substrate 10 includes pixel array 12 in which the plurality of pixels 11 are arranged two-dimensionally, vertical scanner(s) 21 that control pixel array 12, first AD converter circuit 22A that has some analog functions of AD converter 22, and first connection 130 provided on the chip edge and connecting first semiconductor substrate 10 and second semiconductor substrate 20. Pixel array 12 and vertical scanner(s) 21 on first semiconductor substrate 10 share the power supply and the ground. Also, pixel array 12 and first AD converter circuit 22a share the power supply and the ground. This reduces main noise such as random noise.

As described thus far, in solid-state image capture device 1 according to Embodiment 3, first semiconductor substrate 10 includes vertical scanner(s) 21 that scan the pixel rows in pixel array 12, and first AD converter circuit 22A that performs part of AD conversion on signals received from each pixel column in pixel array 12. Second semiconductor substrate 20 includes second AD converter circuit 22B that performs the other part of the AD conversion, output buffer 26 that outputs signals that have undergone AD conversion to external devices, and control circuit 27 that controls second AD converter circuit 22B. Vertical scanner(s) 21 and first AD converter circuit 22A are disposed on the side closer to the center of first semiconductor substrate 10 than first connection 130 in plan view, and second AD converter circuit 22B is disposed on the side closer to the center of second semiconductor substrate 20 than second connection 230 in plan view.

Alternatively, first semiconductor substrate 10 may include vertical scanner(s) 21 that scan the pixel rows in pixel array 12, and first AD converter circuit 22A that performs part of AD conversion on signals received from each pixel column in pixel array 12. Second semiconductor substrate 20 may include second AD converter circuit 22B that performs the other part of the AD conversion, output buffer 26 that outputs signals that have undergone AD conversion to external devices, and control circuit 27 that controls second AD converter circuit 22B. Pixel array 12 may be disposed on the side closer to the center of first semiconductor substrate 10 than vertical scanner(s) 21, first AD converter circuit 22A, and first connection 130 in plan view, and second AD converter circuit 22B may be disposed on the side closer to the center of second semiconductor substrate 20 than second connection 230 in plan view.

Embodiment 4

Solid-state image capture device 1 according to Embodiment 4 is the same as one of solid-state image capture devices 1 according to Embodiments 1 to 3. Embodiment 4 describes a configuration example of mount board 50.

Figure 20:
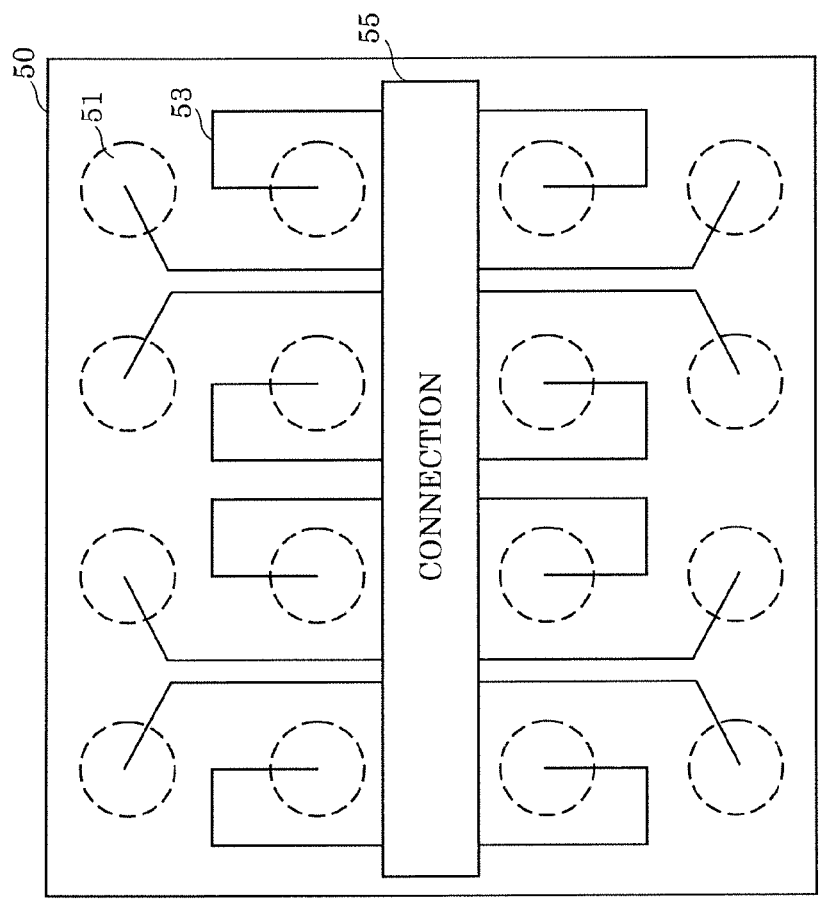
FIG. 20 illustrates an example of connection between a connection disposed on the front face of a mount board and solder balls disposed on the rear face of the mount board according to Embodiment 4.

FIG. 20 illustrates an example of connection between connection 55 disposed on the front face of mount board 50 and solder balls 51 disposed on the rear face according to Embodiment 4.

In FIG. 20, mount board 50 includes a plurality of solder balls 51 provided on the rear face of mount board 50 and electrically connectable to external devices, connection 55 connected to pad area 250 on second semiconductor substrate 20, and lines 53 that connect solder balls 51 and connection electrodes 52 included in connection 55.

Connection 55 includes a plurality of connection electrodes 52. The plurality of connection electrodes 52 are electrically and physically connected to the plurality of pad electrodes 259 on second semiconductor substrate 20. Connection 55 is formed in the region of second semiconductor substrate 20 that opposes pad area 250 in the plan view of solid-state image capture device 1. That is, connection electrodes 52 are formed at positions opposing pad electrodes 259 on second semiconductor substrate 20.

Note that the diameter (referred to as TSV2) of TSVs that connect connection electrodes 52 and pad electrodes 259 and the diameter (referred to as TSV1) of TSVs that connect first connection electrode 139 and second connection electrodes 239 have at least a relationship of TSV1<TSV2. TSV2 has a shape that can ensure electrically large loads such as a surge. In the case where TSVs are not used for connection, pad electrodes may be provided as connection electrodes 52 so as to overlap with and to be connected to pad area 250 on second semiconductor substrate 20.

As described thus far, in solid-state image capture device 1 according to Embodiment 4 described with reference to the drawing, lines 53 that connect connection electrodes 52 and solder balls 51 can be made to have approximately the same length and the same load by disposing connection 55 in the vicinity of the center of the chip. The plurality of lines 53 including solder balls 51 can make the loads uniform, and CSP includes first semiconductor substrate 10, second semiconductor substrate 20, and mount board 50. This achieves a downsizing of the chip.

Embodiment 5

Figure 21:
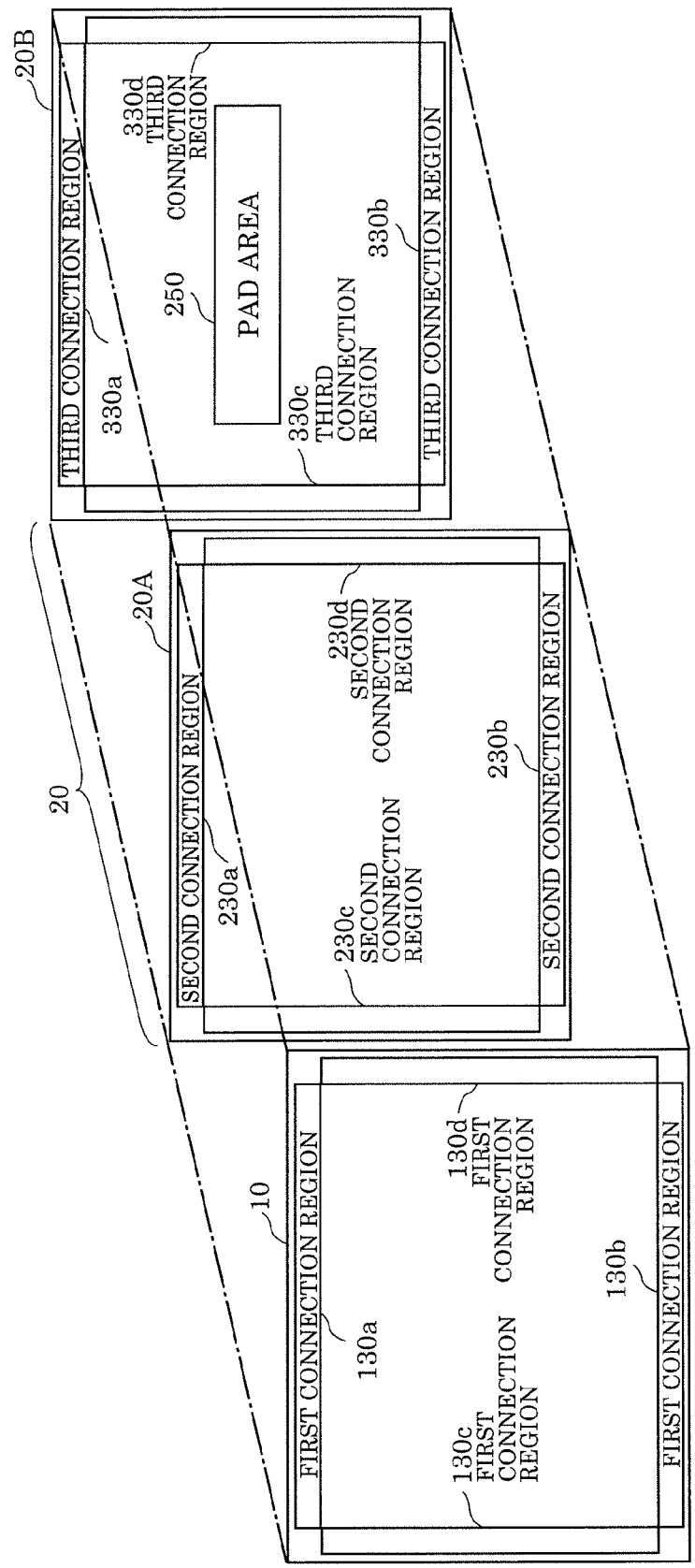
FIG. 21 illustrates a configuration example of a solid-state image capture device according to Embodiment 5.

FIG. 21 illustrates a configuration example of solid-state image capture device 1 according to Embodiment 5.

Compared to one of solid-state image capture devices according to Embodiments 1 to 4, solid-state image capture device 1 in FIG. 21 differs in that second semiconductor substrate 20 is not a single semiconductor substrate but is configured as a stacked body of two semiconductor substrates. The following description focuses on the different point.

Second semiconductor substrate 20 is configured as a stacked body of first sub-substrate 20A and second sub-substrate 20B. First sub-substrate 20A and second sub-substrate 20B have substantially the same size as first semiconductor substrate 10.

First sub-substrate 20A includes second connection 230. In FIG. 21, second connection 230 is divided into and disposed as second connection regions 230a, 230b, 230c, and 230d. A plurality of second connection electrodes 239 included in second connection 230 may be through electrodes that penetrate first sub-substrate 20A from the front face to the rear face. In that case, second connection electrodes 239 are exposed to both the front and rear faces of first sub-substrate 20A. Instead of the above-described connection, vias may be used for connection. Accordingly, the plurality of second connection electrodes 239 are connected not only to a plurality of first connection electrodes 139 on first semiconductor substrate 10, but also to a plurality of third connection electrodes that configure third connection 330 on second sub-substrate 20B. First sub-substrate 20A also includes vertical scanner(s) 21, AD converter 22, memory 23, and peripheral part 24. As in second semiconductor substrates 20 in FIGS. 8 and 14, first sub-substrate 20A does not necessarily have to include vertical scanner(s) 21.

Second sub-substrate 20B includes pad area 250 and third connection 330 that is electrically connected to second connection 230. In FIG. 21, third connection 330 includes third connection regions 330a, 330b, 330c, 330d. Third connection 330 includes the plurality of third connection electrodes. The third connection electrodes are formed at positions opposing second connection electrodes 239 on the rear face of first sub-substrate 20A. Pad area 250 is disposed in the center on the rear face of second sub-substrate 20B in the plan view of solid-state image capture device 1.

As described above, in solid-state image capture device 1 according to Embodiment 5 described with reference to the drawings, first connection 130, second connection 230, and third connection 330 that connect first semiconductor substrate 10, first sub-substrate 20A, and second sub-substrate 20B are disposed on the chip edges. This achieves a downsizing of the chip and an increase in the area ratio of imaging area on first semiconductor substrate 10, and also enables adding new functions of improving the performance of solid-state image capture device 1 to second sub-substrate 20B. For example, second sub-substrate 20B may include a DRAM or the like that has a frame memory function.

As described thus far, in solid-state image capture device 1 according to Embodiment 5, second semiconductor substrate 20 is a stacked body of first sub-substrate 20A and second sub-substrate 20B. First sub-substrate 20A includes second connection 230, and second sub-substrate 20B includes pad area 250 and third connection 330 that is electrically connected to second connection 230. Pad area 250 is disposed in the center of second sub-substrate 20B in the plan view of solid-state image capture device 1.

Pad area 250 may be disposed in a region that includes the center of second sub-substrate 20B in plan view.

Embodiment 6

Figure 22:
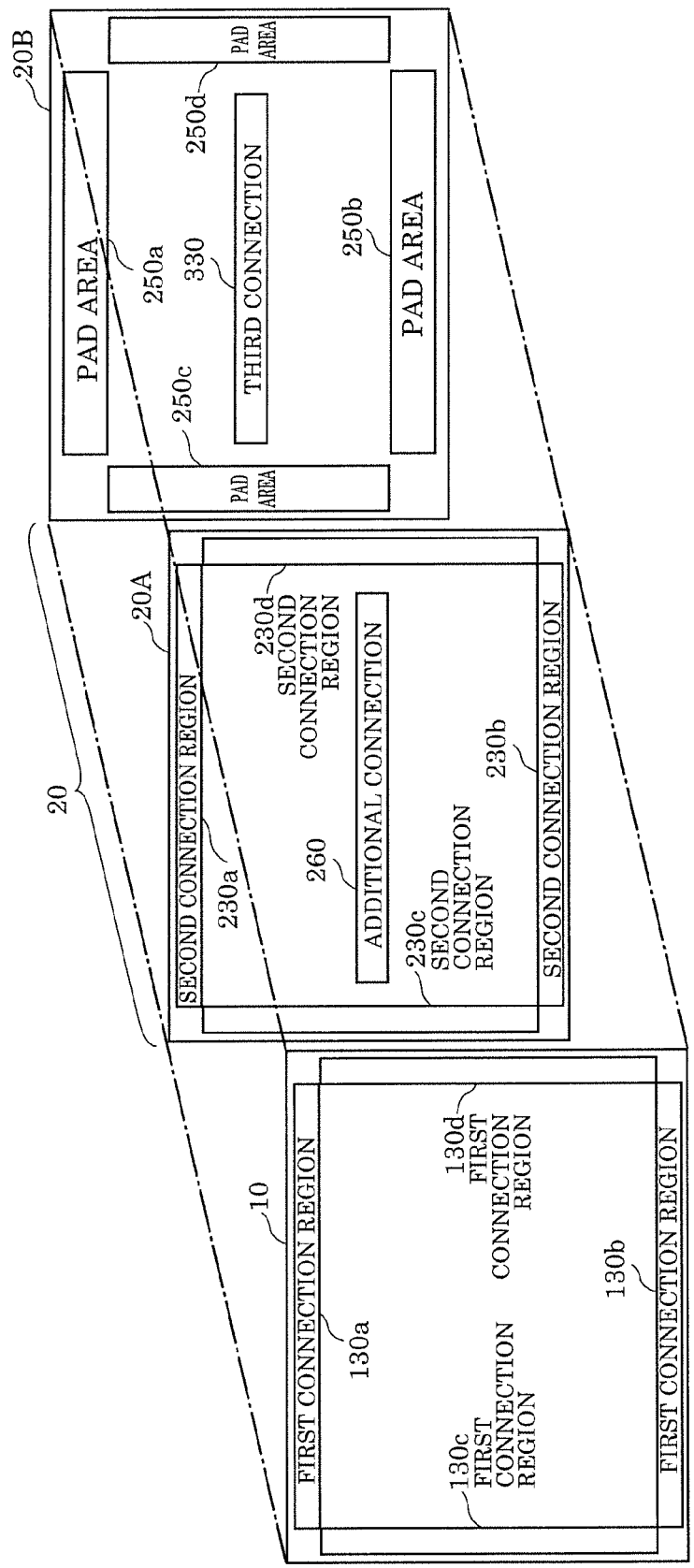
FIG. 22 illustrates a configuration example of a solid-state image capture device according to Embodiment 6.

FIG. 22 illustrates a configuration example of solid-state image capture device 1 according to Embodiment 6.

Compared to one of the solid-state image capture devices according to Embodiments 1 to 4, solid-state image capture device 1 in FIG. 22 differs in that second semiconductor substrate 20 is not a single semiconductor substrate but is configured as a stacked body of two semiconductor substrates. The following description focuses on the different point.

Second semiconductor substrate 20 is configured as a stacked body of first sub-substrate 20A and second sub-substrate 20B.

First sub-substrate 20A includes second connection 230 and additional connection 260.

In FIG. 22, second connection 230 is divided into and disposed as second connection regions 230a, 230b, 230c, and 230d.

Additional connection 260 includes a plurality of additional connection electrodes. The additional connection electrodes are exposed to the rear face of first sub-substrate 20A and electrically and physically connected to a plurality of third connection electrodes included in third connection 330 on the front face of second sub-substrate 20B. First sub-substrate 20A includes vertical scanner 21(s), AD converter 22, memory 23, and peripheral part 24. As in second semiconductor substrates 20 illustrated in FIGS. 8 and 14, first sub-substrate 20A does not necessarily have to include vertical scanner(s) 21.

Second sub-substrate 20B includes pad area 250 and third connection 330 that is electrically connected to additional connection 260 on first sub-substrate 20A.

Third connection 330 includes the plurality of third connection electrodes. The third connection electrodes are exposed to the front face of second sub-substrate 20B, formed at positions opposing the additional connection electrodes on the rear face of first sub-substrate 20A, and electrically and physically connected to the additional connection electrodes.

In FIG. 22, pad area 250 includes pad areas 250*a*, 250*b*, 250*c*, and 250*d* that are disposed on edges along the sides of second sub-substrate 20B in the plan view of solid-state image capture device 1.

As described above, solid-state image capture device 1 according to Embodiment 6 described with reference to the drawings can not only achieve the same effect as in Embodiment 5, but also allow pad electrodes 259 to be grouped and disposed together for each function by disposing pad area 250 on the chip edges of second sub-substrate 20B. This enables suppressing interference of signals. For example, if low-frequency input signals are not arranged in the same region as high-frequency output signals, the positions of the solder balls disposed on the rear face of the CPS are not adjacent to one another, and no interferences occur between low-frequency signals and high-frequency signals outside solid-state image capture device 1. Accordingly, solid-state image capture device 1 can be prevented from malfunctioning.

As described thus far, in solid-state image capture device 1 according to Embodiment 6, second semiconductor substrate 20 is a stacked body of first sub-substrate 20A and second sub-substrate 20B. First sub-substrate 20A includes second connection 230 and additional connection 260, and second sub-substrate 20B includes pad area 250 and third connection 330 that is electrically connected to additional connection 260. Pad area 250 is disposed on the edges along the sides of second sub-substrate 20B in the plan view of solid-state image capture device 1.

Solid-state image capture device 1 may further include mount board 50 having substantially the same size as first semiconductor substrate 10 and second semiconductor substrate 20 and having a front face on which second semiconductor substrate 20 is mounted. Mount board 50 may include the plurality of solder balls 51 mounted on the rear face of mount board 50; the plurality of connection electrodes 52 that are exposed to the front face of mount board 50, disposed at positions opposing the plurality of pad electrodes 259 on second semiconductor substrate 20, and connecting the plurality of pad electrodes 259; and the plurality of lines 53 connecting the plurality of connection electrodes 52 and the plurality of solder balls 51. Connection electrodes 52 may be disposed on the edges along the sides of mount board 50.

Pad area 250 may be disposed on the edges along the sides of second semiconductor substrate 20.

Embodiment 7

Solid-state image capture devices 1 according to Embodiments 1 to 6 described above are suitable for use in image capture devices used in medical equipment that requires an increase in the area ratio of imaging area and downsizing.

Embodiment 7 describes an image capture device that includes solid-state image capture device 1 according to one of Embodiments 1 to 6.

Examples of the image capture devices, i.e., cameras, that require an increase in the area ratio of imaging area and downsizing include elastic endoscopes, hard endoscopes, and capsule endoscopes.

Figure 23:
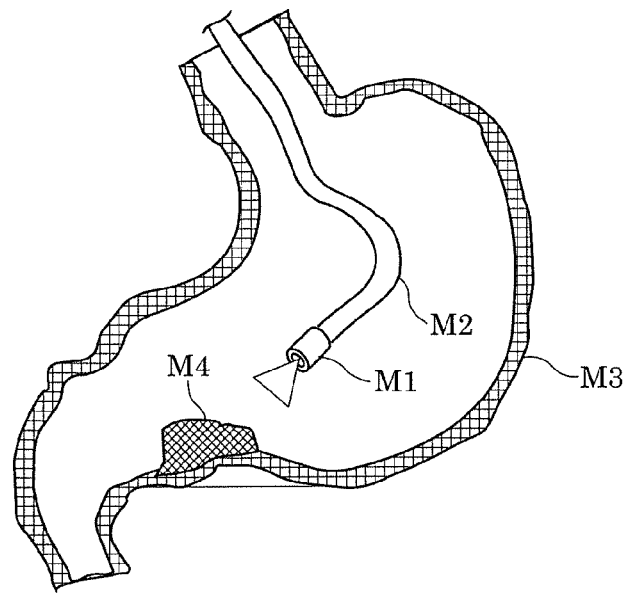
FIG. 23 illustrates an example of an elastic endoscope serving as an image capture device according to Embodiment 7.

FIG. 23 illustrates an example of an elastic endoscope serving as the image capture device according to Embodiment 7. The elastic endoscope is an image capture device that includes cable M2 and camera M1 that includes solid-state image capture device 1 at the tip end. FIG. 23 illustrates how the elastic endoscope captures an image of tumor M4 generated on the inner wall of stomach M3.

For an image capture device serving as a surveillance camera, a downsizing of the image capture device is an absolute necessity in order to keep criminals or the like from catching on to the image capture device. Solid-state image capture device 1 is suitable for use in such an image capture device.

Figure 24:
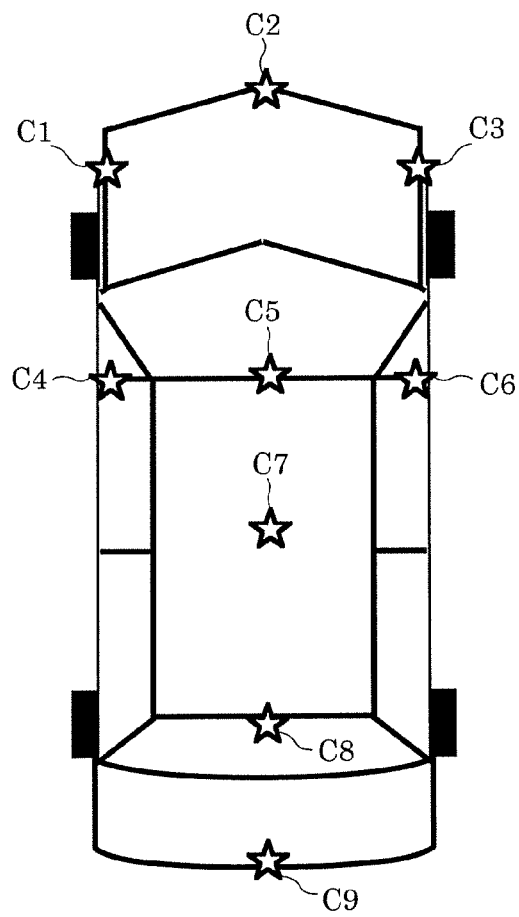
FIG. 24 illustrates an example of a motor vehicle equipped with a vehicle-mounted camera serving as the image capture device according to Embodiment 7.

FIG. 24 illustrates an example of a motor vehicle provided with a vehicle-mounted camera serving as the image capture device according to Embodiment 7. The motor vehicle in FIG. 24 is provided with vehicle-mounted cameras C1 to C3, C5, C8, and C9 disposed on the front and rear sides outside the vehicle, vehicle-mounted cameras C4 and C6 disposed instead of door mirrors, and camera C7 disposed in the interior of the vehicle. Each of vehicle-mounted cameras C1 to C9 includes solid-state image capture device 1 according to one of Embodiments 1 to 6. Vehicle-mounted cameras C1 to C9 are suitable for use as the above-described image capture device as means for reducing excess downforce in consideration of aerodynamic force during driving.

The above-described image capture device is also suitable for use in cameras for mobile products such as glasses or watches that essentially require weight reduction and downsizing.

Figure 25:
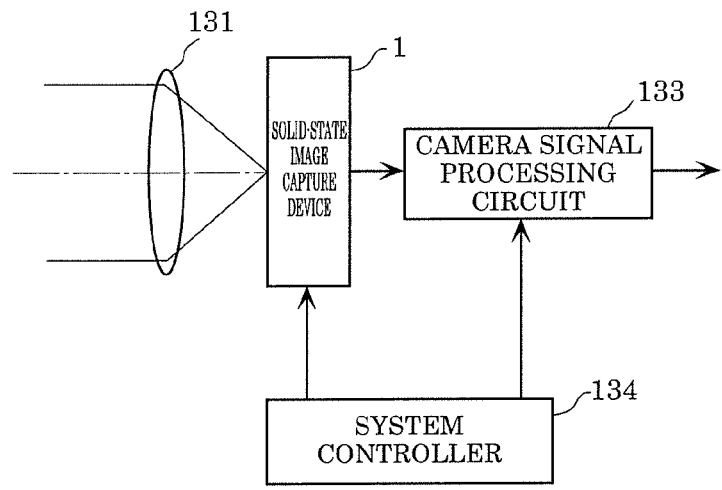
FIG. 25 is a block diagram showing a configuration example of the image capture device according to Embodiment 7.
Figure 26:
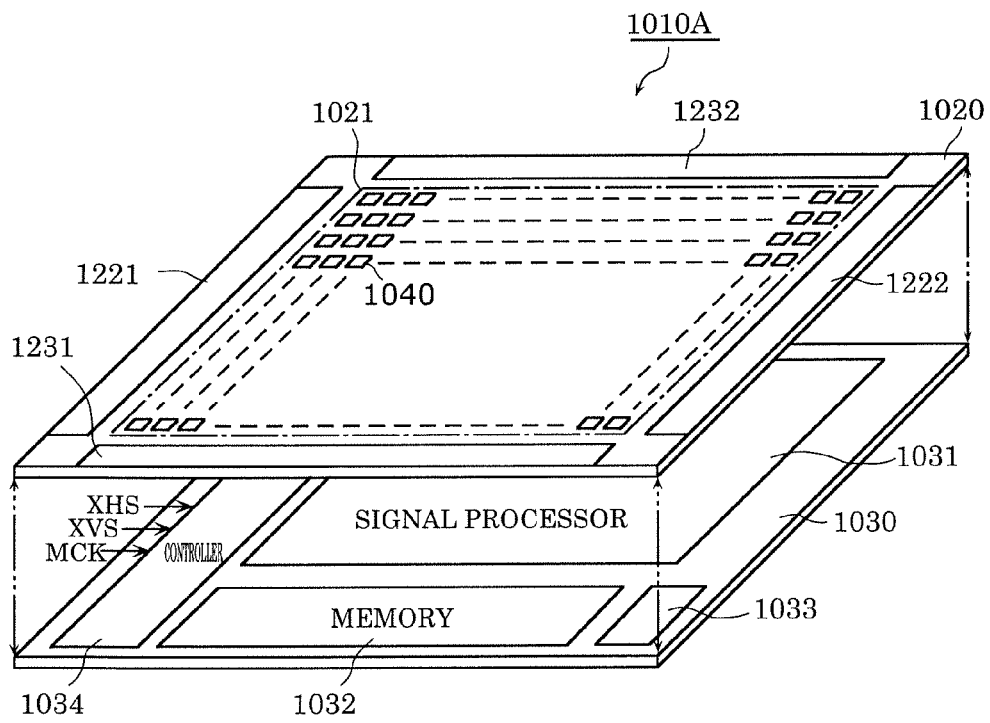
FIG. 26 illustrates a configuration of a conventional solid-state image capture device.

FIG. 25 is a block diagram illustrating a configuration example of the image capture device according to Embodiment 7. As illustrated in FIG. 25, the image capture device according to the present embodiment includes, for example, an optical system including lens 131, solid-state image capture device 1, camera signal processing circuit 133, and system controller 134. Lens 131 forms an image of light received from a subject on the imaging face of solid-state image capture device 1. Solid-state image capture device 1 outputs image signals obtained by converting the image of light formed on the imaging face by lens 131 into electrical signals in units of pixels. The solid-state image capture device according to one of Embodiments 1 to 6 is used as solid-state image capture device 1. Camera signal processing circuit 133 performs various types of signal processing on the image signals output from solid-state image capture device 1. System controller 134 controls solid-state image capture device 1 and camera signal processing circuit 133.

In this way, the image capture device according to the present embodiment includes solid-state image capture device 1 according to one of Embodiments 1 to 6. Accordingly, it is possible to suppress degradation of the image caused by random noise while increasing an operating margin of each pixel.

INDUSTRIAL APPLICABILITY

The present disclosure is useful for a solid-state image capture device and an image capture device and is usable as cameras for medical use, cameras for surveillance use, cameras for vehicle use, and cameras for some mobile products.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

What is claimed is:

1. A solid-state image capture device comprising:
a first semiconductor substrate including a first connection and a pixel array in which a plurality of pixels are arranged in a matrix; and
a second semiconductor substrate that controls the pixel array and includes a second connection and a pad area including a plurality of pad electrodes for making electrical connection to external equipment,
wherein some of the plurality of pad electrodes are a power supply and a ground,
the first semiconductor substrate and the second semiconductor substrate are stacked and joined together, with the first connection and the second connection electrically connected to each other,
the first semiconductor substrate and the second semiconductor substrate are substantially equal in size,
the plurality of pad electrodes are provided only to the second semiconductor substrate, and no pad electrode for making electrical connection to external equipment is provided to the first semiconductor substrate, and
the first semiconductor substrate includes a vertical scanner that scans pixel rows in the pixel array.

2. The solid-state image capture device according to claim 1,
wherein the second semiconductor substrate includes:
an output buffer that outputs a signal based on the pixel array, and
a control circuit that controls the output buffer; and
the pad area, the output buffer, and the control circuit are disposed on a side closer to a center of the second semiconductor substrate than the second connection in a plan view of the solid-state image capture device.

3. The solid-state image capture device according to claim 2,
wherein the first connection includes a plurality of first connection electrodes that transmit and receive signals to and from the pixel array,
the plurality of first connection electrodes are exposed to a face opposing the second semiconductor substrate out of two faces of the first semiconductor substrate,
the second connection includes a plurality of second connection electrodes,
the plurality of second connection electrodes are exposed to a face opposing the first semiconductor substrate out of two faces of the second semiconductor substrate, disposed at positions opposing the plurality of first connection electrodes, and electrically connected to the plurality of first connection electrodes, and
each of the plurality of first connection electrodes and the plurality of second connection electrodes has a smaller size than the plurality of pad electrodes in the plan view.

4. The solid-state image capture device according to claim 2,
wherein the plurality of first connection electrodes are distributed and disposed in a plurality of first connection regions, and
the plurality of first connection regions include two or more first connection regions that are formed along two or more sides among four sides of the first semiconductor substrate in the plan view.

5. The solid-state image capture device according to claim 3,
wherein a total number of the plurality of first connection electrodes is greater than a sum of a total number of pixel rows and a total number of pixel columns in the pixel array.

6. The solid-state image capture device according to claim 3,
wherein a total number of the plurality of first connection electrodes is greater than a total number of pixel columns in the pixel array.

7. The solid-state image capture device according to claim 2,
wherein the second semiconductor substrate includes:
an AD converter that performs an AD conversion on a signal received from each pixel column in the pixel array;
the output buffer that outputs a signal that has undergone the AD conversion to external equipment via the pad area; and
the control circuit that controls the AD converter,
the vertical scanner is disposed on a side closer to a center of the first semiconductor substrate than the first connection in the plan view, and
the AD converter is disposed on the side closer to the center of the second semiconductor substrate than the second connection in the plan view.

8. The solid-state image capture device according to claim 2,
wherein the second semiconductor substrate includes:
an AD converter that performs an AD conversion on a signal received from each pixel column in the pixel array;
the output buffer that outputs a signal that has undergone the AD conversion to external equipment via the pad area; and
the control circuit that controls the AD converter,
the vertical scanner is disposed on a peripheral side of the first semiconductor substrate to avoid an overlap with the first connection in the plan view,
the pixel array is disposed on a side closer to a center of the first semiconductor substrate than the vertical scanner and the first connection in the plan view, and
the AD converter is disposed on the side closer to the center of the second semiconductor substrate than the second connection in the plan view.

9. The solid-state image capture device according to claim 2,
wherein the first semiconductor substrate includes:
the vertical scanner; and
a first AD converter circuit that performs a part of an AD conversion on a signal received from each pixel column in the pixel array,
the second semiconductor substrate includes:
a second AD converter circuit that performs the other part of the AD conversion;
the output buffer that outputs a signal that has undergone AD conversion to external equipment; and
the control circuit that controls the second AD converter circuit, the vertical scanner and the first AD converter circuit are disposed on a side closer to a center of the first semiconductor substrate than the first connection in the plan view, and the second AD converter circuit is disposed on the side closer to the center of the second semiconductor substrate than the second connection in the plan view.

10. The solid-state image capture device according to claim 2, wherein the first semiconductor substrate includes:

the vertical scanner; and a first AD converter circuit that performs a part of an AD conversion on a signal received from each pixel column in the pixel array, the second semiconductor substrate includes:

a second AD converter circuit that performs the other part of the AD conversion;

the output buffer that outputs a signal that has undergone AD conversion to external equipment; and the control circuit that controls the second AD converter circuit, the pixel array is disposed on a side closer to a center of the first semiconductor substrate than the vertical scanner, the first AD converter circuit, and the first connection in the plan view, and the second AD converter circuit is disposed on the side closer to the center of the second semiconductor substrate than the second connection in the plan view.

11. The solid-state image capture device according to claim 2, further comprising:

a mount board that is substantially equal in size to the first semiconductor substrate and the second semiconductor substrate and has a front face on which the second semiconductor substrate is mounted, the mount board including:

a plurality of solder balls attached to a rear face of the mount board;

a plurality of connection electrodes exposed to the front face of the mount board, disposed at positions opposing the plurality of pad electrodes on the second semiconductor substrate, and connecting the plurality of pad electrodes; and a plurality of lines that connect the plurality of connection electrodes and the plurality of solder balls, respectively.

12. The solid-state image capture device according to claim 1, further comprising:

a mount board that is substantially equal in size to the first semiconductor substrate and the second semiconductor substrate and has a front face on which the second semiconductor substrate is mounted, and wherein the mount board includes:

a plurality of solder balls attached to a rear face of the mount board;

a plurality of connection electrodes exposed to the front face of the mount board, disposed at positions opposing the plurality of pad electrodes on the second semiconductor substrate, and connecting the plurality of pad electrodes; and a plurality of lines that connect the plurality of connection electrodes and the plurality of solder balls, and the plurality of connection electrodes are disposed on edges along sides of the mount board.

13. The solid-state image capture device according to claim 11, wherein the plurality of connection electrodes are disposed in a region that includes a center of the mount board in the plan view.

14. The solid-state image capture device according to claim 12, wherein the plurality of lines on the mount board include a through line that penetrates the mount board from the front face to the rear face.

15. The solid-state image capture device according to claim 12, wherein the plurality of connection electrodes on the mount board are pad electrodes.

16. The solid-state image capture device according to claim 2, wherein the pad area is disposed in a region that includes the center of the second semiconductor substrate in the plan view.

17. The solid-state image capture device according to claim 1, wherein the pad area is disposed on an edge along a side of the second semiconductor substrate.

18. An image capture device comprising:

the solid-state image capture device according to claim 1; and an optical system.

19. The solid-state image capture device according to claim 11, wherein the pixel array and the vertical scanner share the power supply and the ground.

* * * * *